(12) United States Patent
Lee et al.

(10) Patent No.: US 11,683,969 B2
(45) Date of Patent: Jun. 20, 2023

(54) ELECTRONIC APPARATUS

(71) Applicant: SAMSUNG DISPLAY CO., LTD., Yongin-si (KR)

(72) Inventors: Kyungsu Lee, Suwon-si (KR); Il-Joo Kim, Hwaseong-si (KR); Jong-Hwa Kim, Gyeonggi-Do (KR); Jeongyun Han, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 240 days.

(21) Appl. No.: 17/280,860

(22) PCT Filed: Feb. 21, 2019

(86) PCT No.: PCT/KR2019/002174
§ 371 (c)(1),
(2) Date: Mar. 26, 2021

(87) PCT Pub. No.: WO2020/075927
PCT Pub. Date: Apr. 16, 2020

(65) Prior Publication Data
US 2022/0005878 A1    Jan. 6, 2022

(30) Foreign Application Priority Data

Oct. 12, 2018  (KR) .................. 10-2018-0122068

(51) Int. Cl.
*G06F 3/044* (2006.01)
*H01L 27/32* (2006.01)
*G06F 3/041* (2006.01)

(52) U.S. Cl.
CPC .......... *H01L 27/323* (2013.01); *G06F 3/0412* (2013.01); *G06F 3/0446* (2019.05);
(Continued)

(58) Field of Classification Search
CPC .... G06F 3/0412; G06F 3/0446; G06F 3/0443; G06F 3/044; G06F 3/041–047;
(Continued)

(56) References Cited

U.S. PATENT DOCUMENTS 7,839,591 B1    11/2010  Shimodaira
8,970,515 B2    3/2015   Noran et al.
(Continued)

FOREIGN PATENT DOCUMENTS

JP      2008-129243    6/2008
KR    10-2008-0019384  3/2008
(Continued)

*Primary Examiner* — Sanjiv D. Patel
(74) *Attorney, Agent, or Firm* — F. Chau & Associates, LLC

(57) ABSTRACT

An electronic apparatus has a through module hole defined in an active area and includes a first sensing pattern and a second sensing pattern spaced apart from each other in one direction with the module hole disposed therebetween. A third sensing pattern and a fourth sensing pattern are spaced apart from each other in a direction crossing the one direction with the module hole disposed therebetween. A first connection line extends along a portion of the module hole and connects the first sensing pattern acid the second sensing pattern to each other. A second connection line extends along a portion of the module hole and connects the third sensing pattern and the fourth sensing pattern to each other. The first connection line and the second connection line are disposed on the same layer and are spaced apart from each other.

30 Claims, 30 Drawing Sheets

Figure 1A:
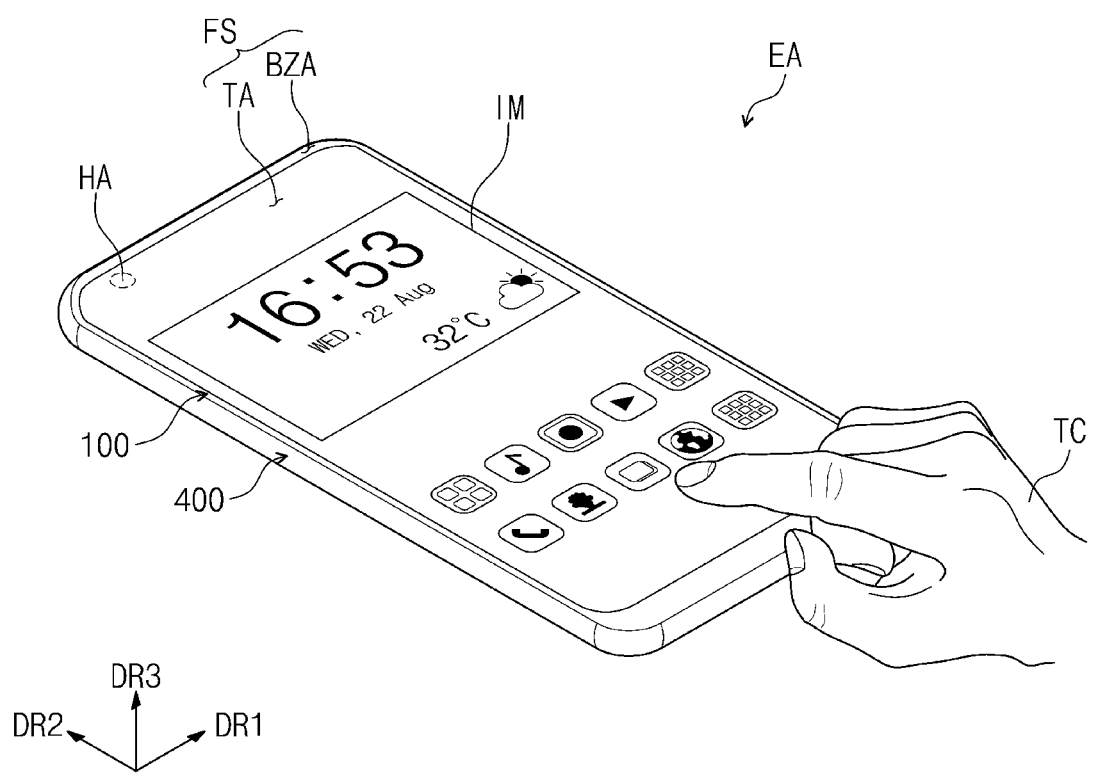

(52) U.S. Cl.
   CPC ...... *G06F 3/04164* (2019.05); *H01L 27/3276* (2013.01); *G06F 2203/04112* (2013.01)
(58) Field of Classification Search
   CPC . G06F 2203/041–04114; G06F 3/0445; H01L 27/323
   See application file for complete search history.

(56) References Cited

U.S. PATENT DOCUMENTS

| | | |
|---|---|---|
| 10,134,826 B2 | 11/2018 | Ka et al. |
| 10,171,836 B2 | 1/2019 | Yeo et al. |
| 10,186,191 B2 | 1/2019 | Kang et al. |
| 10,466,822 B2 | 11/2019 | Kim et al. |
| 10,669,826 B2 | 3/2020 | Choi et al. |
| 2011/0242028 A1 | 10/2011 | Lee et al. |
| 2020/0258957 A1 | 8/2020 | Kwak et al. |

FOREIGN PATENT DOCUMENTS

| | | |
|---|---|---|
| KR | 10-2011-0111192 | 10/2011 |
| KR | 10-2014-0086708 | 7/2014 |
| KR | 10-2017-0059527 | 5/2017 |
| KR | 10-2017-0065059 | 6/2017 |
| KR | 10-2017-0111827 | 10/2017 |
| KR | 10-2017-0112790 | 10/2017 |
| KR | 10-2017-0117291 | 10/2017 |
| KR | 10-1786119 | 10/2017 |
| KR | 10-2018-0063633 | 6/2018 |

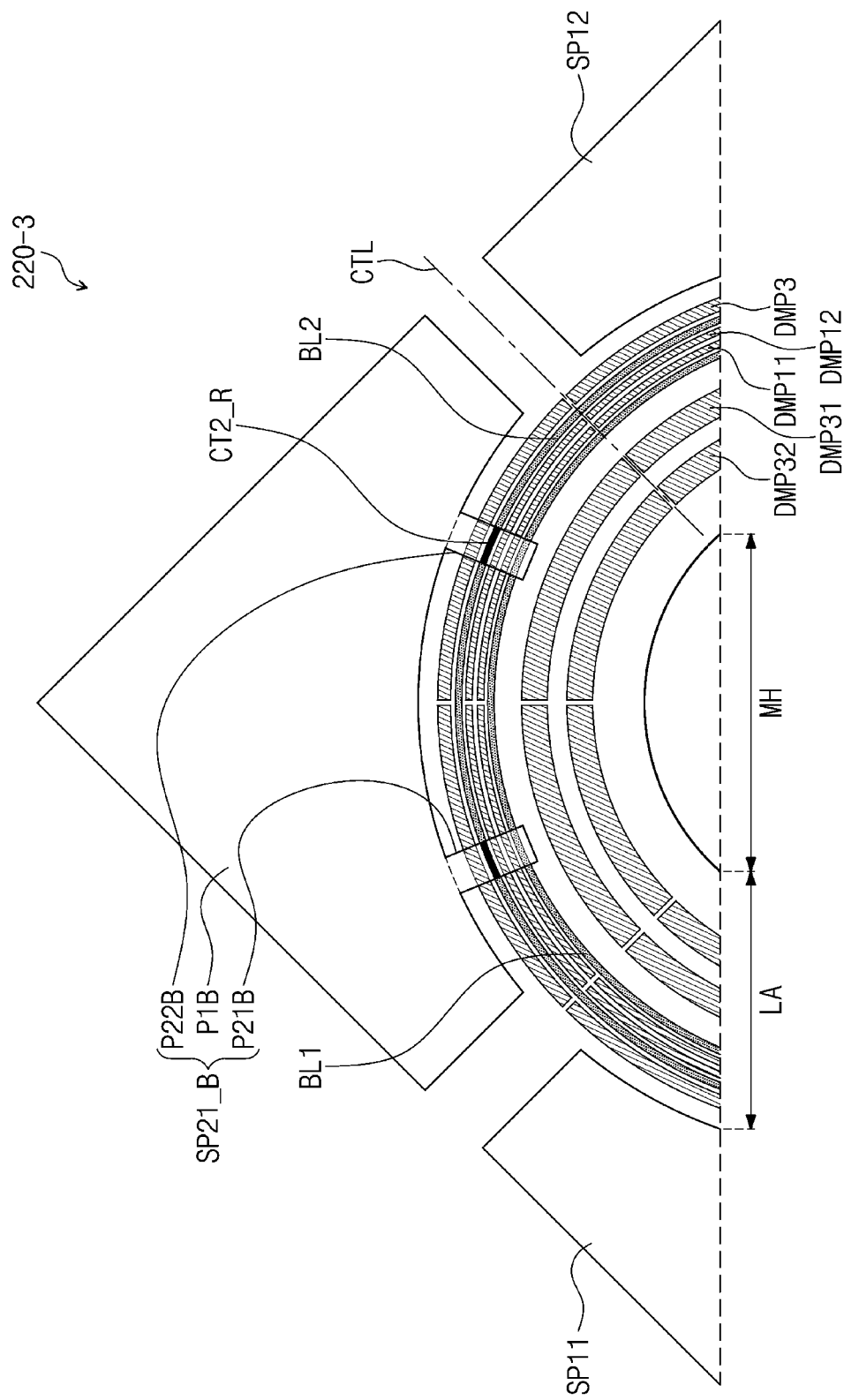

ELECTRONIC APPARATUS

CROSS-REFERENCE TO RELATED APPLICATION

The present application is a National Stage application, filed under 35 U.S.C. § 371, of International Patent Application No. PCT/KR2019/002174, filed on Feb. 21, 2019, which claims priority to Korean Patent Application No. KR 10-2018-0122068, filed on Oct. 12, 2018, the contents of which are incorporated by reference herein in their entirety.

TECHNICAL FIELD

The present invention disclosed herein relates to an electronic apparatus, and more particularly, to an electronic apparatus detecting external inputs.

DISCUSSION OF THE RELATED ART

Electronic apparatuses are activated according to electrical signals. The electronic apparatuses may include devices composed of various electronic components, such as a display unit displaying images or a sensing unit detecting external inputs. The electronic components may be electrically connected to one another through variously arranged signal lines.

The display unit includes light emitting elements that, together, display images. The sensing unit may include sensing electrodes for detecting external inputs such as touch events. The sensing electrodes are disposed in an active area. The sensing unit is configured to provide an even level of sensitivity over an entire surface of the active area.

SUMMARY

An electronic apparatus includes a base substrate including an active area and a peripheral area adjacent to the active area. A display unit is disposed on the base substrate and is configured to display an image within the active area. A sensing unit is disposed on the display unit and is configured to detect an external input applied to the active area. In the active area, a module hole penetrating the base substrate, the display unit, and the sensing unit is defined. The sensing unit includes a first sensing pattern and a second sensing pattern spaced apart from each other in a first direction with the module hole disposed therebetween. A third sensing pattern and a fourth sensing pattern are spaced apart from each other in a second direction crossing the first direction with the module hole disposed therebetween. A first connection line extends along a portion of the module hole and connects the first sensing pattern and the second sensing pattern to each other. A second connection line extends along a portion of the module hole and connects the third sensing pattern and the fourth sensing pattern to each other. The first connection line and the second connection line are disposed on a same layer and are spaced apart from each other.

An electronic apparatus includes a window member including a transmission area and a bezel area adjacent to the transmission area. An electronic panel is disposed below the window member, the electronic panel includes a plurality of sensing electrodes overlapping the transmission area and having a module hole overlapping and penetrating the transmission area defined therein. An electronic module is disposed below the window member and overlaps the module hole. The sensing electrodes include a first sensing pattern and a second sensing pattern spaced apart from each other in a first direction with the module hole disposed therebetween. A third sensing pattern and a fourth sensing pattern are spaced apart from each other in a second direction crossing the first direction with the module hole disposed therebetween. A first connection line is disposed adjacent to the module hole and connects the first sensing pattern and the second sensing pattern to each other. A second connection line is disposed adjacent to the module hole and connects the third sensing pattern and the fourth sensing pattern to each other. The first connection line and the second connection line are spaced apart from each other.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 1A is a perspective view of an electronic apparatus according to an embodiment of the present invention;

FIG. 1B is an exploded perspective view of FIG. 1A;

FIG. 2 is a block diagram of the electronic apparatus shown in FIG. 1A;

FIG. 3A is a plan view of a display unit according to an embodiment of the present invention;

FIG. 3B is a plan view enlarging a portion of FIG. 3A;

FIG. 3C is a plan view of a sensing unit according to an embodiment of the present invention;

FIGS. 4A and 4B are cross-sectional views illustrating a portion of an electronic apparatus according to an embodiment of the present invention;

FIGS. 5A to 5C are plan views illustrating a portion of a sensing unit according to an embodiment of the present invention;

FIGS. 6A to 6C are cross-sectional views illustrating a portion of a sensing unit according to an embodiment of the present invention;

FIGS. 7A to 7D are plan views illustrating a portion of a sensing unit according to an embodiment of the present invention;

FIGS. 8A to 8D are plan views illustrating a portion of a sensing unit according to an embodiment of the present invention;

FIG. 9A is a plan view illustrating a portion of a sensing unit according to an embodiment of the present invention;

FIG. 9B is a plan view enlarging area ZZ' shown in FIG. 9A;

FIG. 9C is a plan view illustrating a portion of a sensing unit according to an embodiment of the present invention;

FIGS. 10A and 10B are plan views illustrating a portion of a sensing unit according to an embodiment of the present invention;

FIG. 11A is an exploded perspective view of an electronic apparatus according to an embodiment of the present invention;

FIG. 11B is a plan view illustrating a partial configuration of FIG. 11A;

FIG. 12A is an exploded perspective view of an electronic apparatus according to an embodiment of the present invention; and FIGS. 12B and 12C are plan views illustrating a portion of a sensing unit according to an embodiment of the present invention.

DETAILED DESCRIPTION OF THE DRAWINGS

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

In the present disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present invention pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the present invention will be described with reference to the accompanying drawings.

Figure 1B:
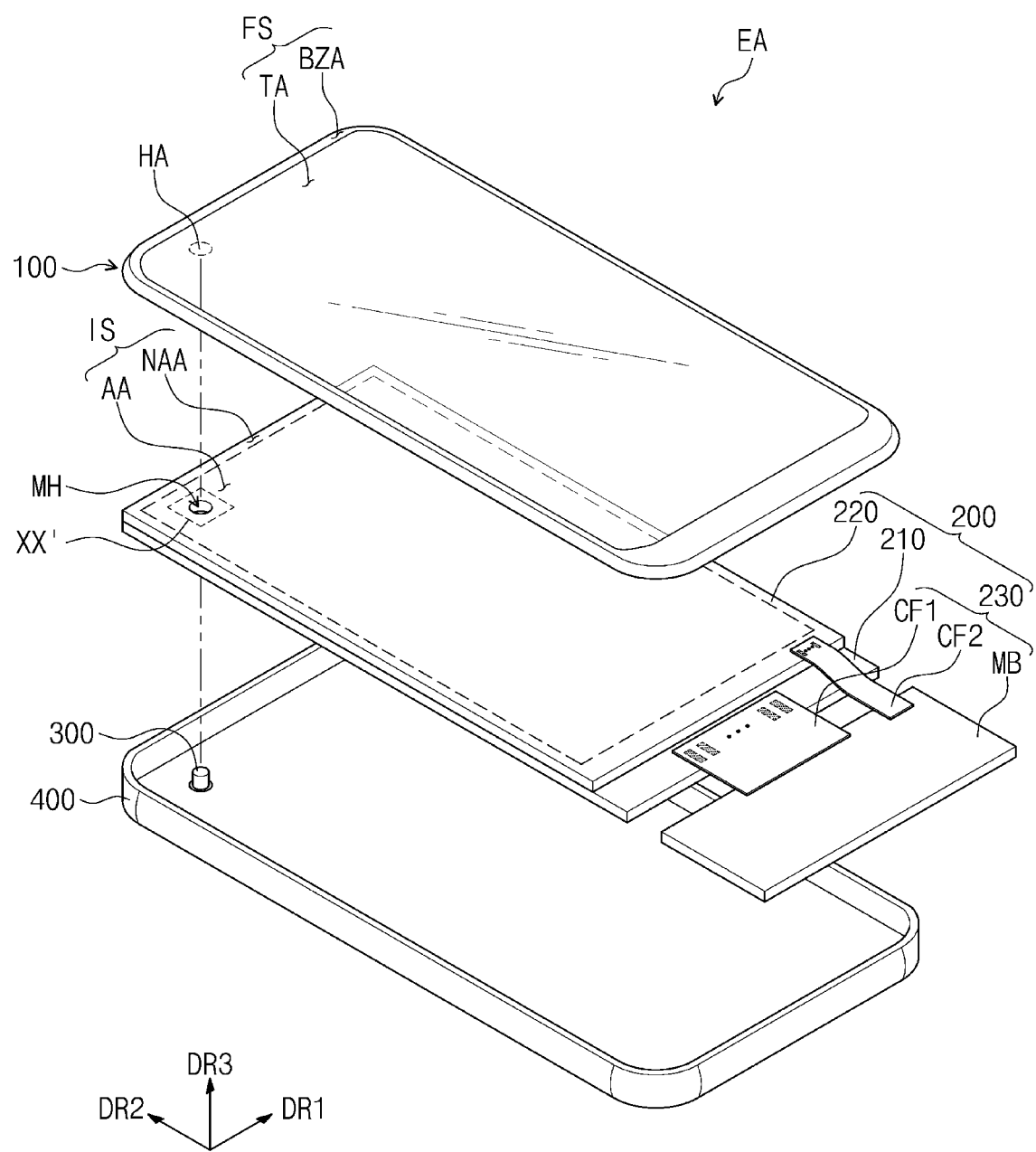
Figure 2:
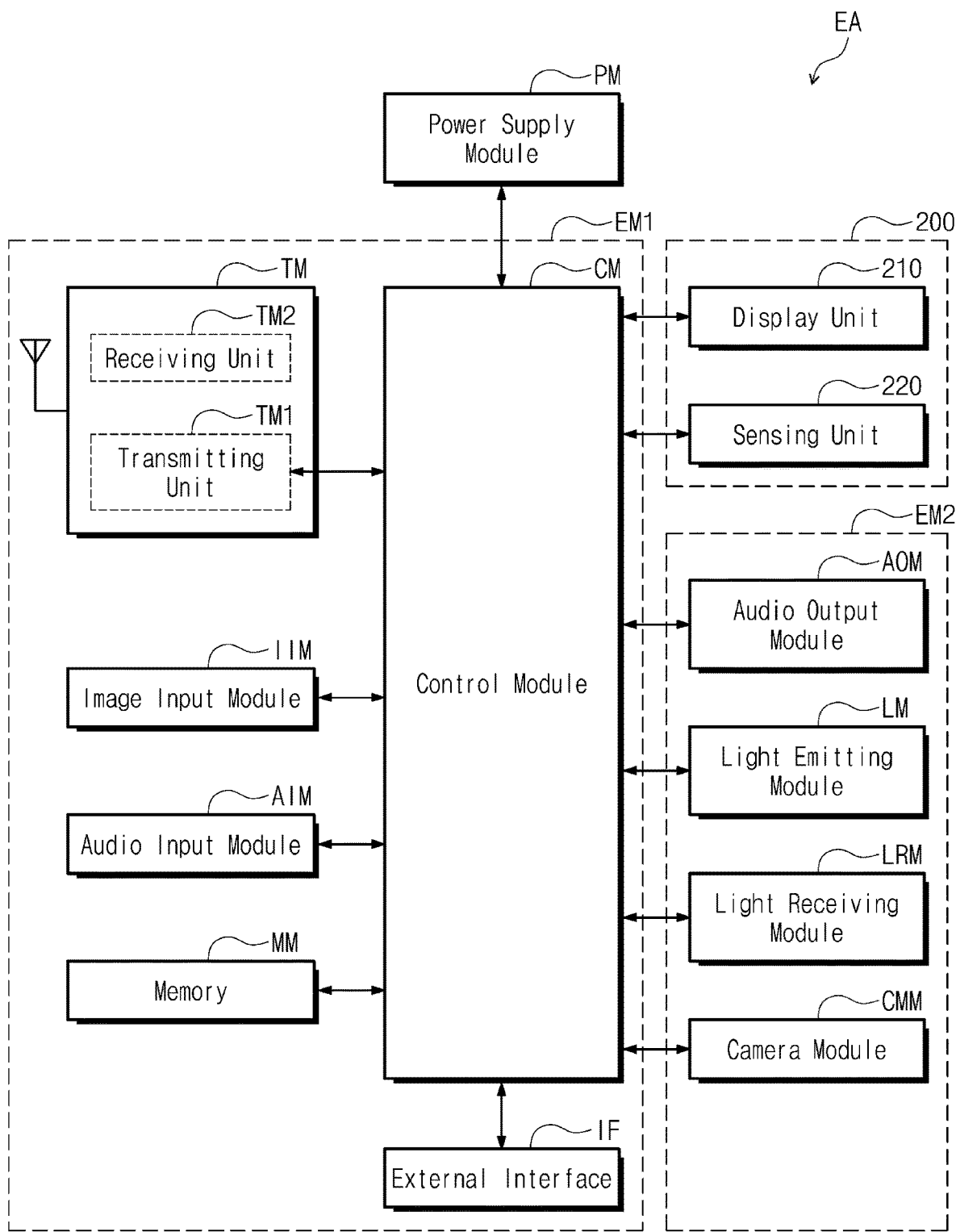

FIG. 1 is a perspective view of an electronic apparatus according to an embodiment of the present invention. FIG. 1B is an exploded perspective view of FIG. 1A. FIG. 2 is a block diagram of the electronic apparatus shown in FIG. 1A. Hereinafter, the present invention will be described with reference to FIGS. 1A to 2.

An electronic apparatus EA may be an apparatus activated according to electrical signals. The electronic apparatus EA may include various embodiments. For example, the electronic apparatus EA may include tablets, laptop computers, computers, and smart televisions, etc. In the present embodiment, a smartphone is exemplarily illustrated as the electronic apparatus EA.

The electronic apparatus EA may display an image IM towards a third direction DR3 on a display surface IS parallel to each of a first direction DR1 and a second direction DR2. The display surface IS on which the image IM is displayed may correspond to a front surface of the electronic apparatus EA and correspond to a front surface FS of a window member 100. The display surface and front surface of the electronic apparatus EA, and the front surface of the window member 100 will be given the same reference numerals. The image IM may include a still image as well as a dynamic image. In FIG. 1A, an internet search box is shown as an example of the image IM.

In the present embodiment, a front surface (or an upper surface) and a rear surface (or a lower surface) of respective members are defined with respect to a direction in which the image IM is displayed. The front and rear surfaces may oppose each other in the third direction DR3 and the normal direction of each of the front and rear surfaces may be parallel to the third direction DR3. A separation distance in the third direction DR3 between the front surface and the rear surface may correspond to a thickness in the third direction DR3 of a display panel DP. Meanwhile, a direction indicated by the first to third directions DR1, DR2, and DR3 are relative concepts, and may thus be changed to other directions. Hereinafter, first to third directions correspond to directions indicated by the first to third direction DR1, DR2, and DR3, respectively, and are given the same reference numerals.

In addition, for example, the electronic apparatus EA according to an embodiment of the present invention may detect a user's input TC applied from the outside. The user's input TC includes various forms of external inputs such as a part of a user's body, light, heat, or pressure. In the present embodiment, a user's hand applied to the front is shown as the user's input TC. However, this is presented as an example, and as described above, the user's input TC may be provided in various forms, and also the electronic apparatus EA may detect the user's input TC applied to sides or the rear surface of the electronic apparatus EA according to structures of the electronic apparatus EA, and is not limited to any one embodiment.

Meanwhile, in the present embodiment, a transmission area TA may include a predetermined hole area HA. The hole area HA may be an area overlapping a module hole MH penetrating an electronic panel 200, which will be described later, and may be an area overlapping an electronic module 300. The electronic apparatus EA may receive external signals required for the electronic module 300 through the hall area HA, or may provide signals output from the electronic module 300 to the outside. According to the present invention, the hole area HA is provided to overlap the transmission area TA, and a separate area given for providing the hole area HA outside the transmission area TA may thus be omitted. Accordingly, an area of the bezel area BZA may be reduced. Detailed descriptions will be described later.

The electronic apparatus EA includes a window member 100, an electronic panel 200, an electronic module 300, and a housing unit 400. In the present embodiment, the window member 100 and the housing unit 400 combine together to form the exterior of the electronic apparatus EA.

The window member 100 may include an insulating panel. For example, the window member 100 may be formed of glass, plastic, or a combination thereof.

As described above, the front surface FS of the window member 100 defines a front surface of the electronic apparatus EA. The transmission area TA may be an optically transparent area. For example, the transmission area TA may be an area having a visible light transmittance of about 90% or greater.

The bezel area BZA may be an area having a relatively lower light transmittance than the transmission area TA. The bezel area BZA defines a shape of the transmission area TA. The bezel area BZA may be adjacent to the transmission area TA and surround the transmission area TA.

The bezel area BZA may have a predetermined color. The bezel area BZA may cover a peripheral area NAA of the electronic panel 200 to prevent the peripheral area NAA from being viewed from the outside. Meanwhile, this is presented as an example, and in the window member 100 according to an embodiment of the present invention, the bezel area BZA may be omitted.

The electronic panel 200 may display an image IM and detect an external input TC. The electronic panel 200 includes a front surface IS having an active area AA and a peripheral area NAA. The active area AA may be an area activated according to electrical signals.

In the present embodiment, the active area AA may be an area displaying the image IM and detecting the external input TC as well. The transmission area TA overlaps at least the active area AA. For example, the transmission area TA overlaps a front surface or at least a portion of the active area AA. Accordingly, users may view the image IM through the transmission area TA or provide the external input TC. However, this is presented as an example, and in the active area AA, an area displaying the image IM and an area detecting the external input TC may be separated from each other, and the embodiment of the present invention is not limited to any one.

The peripheral area NAA may be an area covered by the bezel area BZA. The peripheral area NAA may be adjacent to the active area AA. The peripheral area NAA may surround the active area AA. Driving circuits or driving wiring for driving the active area AA may be disposed in the peripheral area NAA.

In the present embodiment, the electronic panel 200 is assembled in a flat form in which the active area AA and the peripheral area NAA face the window member 100. However, this is presented as an example, and a portion of the peripheral area NAA of the electronic panel 200 may be bent. In this case, the portion of the peripheral area NAA may face the rear surface of the electronic apparatus EA, thereby reducing the bezel area BZA in the front surface of the electronic apparatus EA. Alternatively, the electronic panel 200 may be assembled in a form in which a portion of the active area AA is bent as well. Alternatively, in the electronic panel 200 according to an embodiment of the present invention, the peripheral area NAA may be omitted.

The electronic panel 200 includes a display unit 210, a sensing unit 220, and a driving circuit 230.

The display unit 210 may be a component configured to substantially generate an image IM. The image IM generated from the display unit 210 is displayed on the display surface IS through the transmission area TA to be viewed by users from the outside.

The sensing unit 220 detects an external input TC applied from the outside. As described above, the sensing unit 220 may detect the external input TC provided to the window member 100.

The driving circuit 230 is electrically connected to the display unit 210 and the sensing unit 220. The driving circuit 230 includes a main circuit board MB, a first circuit board CF1, and a second circuit board CF2.

The first circuit board CF1 is electrically connected to the display unit 210. The first circuit board CF1 may connect the display unit 210 and the main circuit board MB. In the present embodiment, the first circuit board CF1 is illustrated as a flexible circuit film. However, this is presented as an example, and the first circuit board CF1 may not be connected to the main circuit board MB and may be a rigid board.

The first circuit board CF1 may be connected to pads (display pads) of the display unit 210 disposed in the peripheral area NAA. The first circuit board CF1 provides electrical signals for driving the display unit 210 to the display unit 210. The electrical signals may be generated from the first circuit board CF1 or be generated from the main circuit board MB.

The second circuit board CF2 is electrically connected to the sensing unit 220. The second circuit board CF2 may connect the sensing unit 220 and the main circuit board MB. In the present embodiment, the second circuit board CF2 is illustrated as a flexible circuit film. However, this is presented as an example, and the second circuit board CF2 may not be connected to the main circuit board MB and may be a rigid board.

The second circuit board CF2 may be connected to pads (sensing pads) of the sensing unit 220 disposed in the peripheral area NAA. The second circuit board CF2 provides electrical signals for driving the sensing unit 220 to the sensing unit 220. The electrical signals may be generated from the second circuit board CF2 or be generated from the main circuit board MB.

The main circuit board MB may include various driving circuits for driving the electronic panel 200 or a connector for supplying power. The first circuit board CF1 and the second circuit board CF2 each may be connected to the main circuit board MB. According to the present invention, the electronic panel 200 may be readily controlled through one main circuit board MB. However, this is presented as an example, and in the electronic panel 200 according to an embodiment of the present invention, the display unit 210 and the sensing unit 220 each may be connected to different main circuit boards, any one of the circuit board CF1 or the second circuit board CF2 may not be connected to the main circuit board MB, and the embodiment of the present invention is not limited to any one.

Meanwhile, a predetermined hole MH (hereinafter, referred to as a module hole) may be defined in the electronic panel 200 according to an embodiment of the present invention. The module hole MH is defined in the active area AA to pass through the electronic panel 200. The module hole MH may pass through the display unit 210 and the sensing unit 220. The module hole MH is defined in the active area AA, and the hole area HA may thus be provided in the transmission area TA.

An electronic module 300 is disposed below the window member 100. The electronic module 300 may overlap the module hole MH on a plane and overlap the hole area HA. The electronic module 300 may receive external inputs transmitted through the hall area HA or provide outputs through the hall area HA. At least a portion of the electronic module 300 may be accommodated in the module hole MH. According to the present invention, the electronic module 300 is disposed to overlap the active area AA to prevent the bezel area BZA from increasing.

Referring to FIG. 2, the electronic apparatus EA may include an electronic panel 200, a power supply module PM, a first electronic module EM1, and a second electronic module EM2. The electronic panel 200, the power supply module PM, the first electronic module EM1, and the second electronic module EM2 may be electrically connected to each other. In FIG. 2, the display unit 210 and the sensing unit 220 among the components of the electronic panel 200 are illustrated as examples.

The power supply module PM supplies power required for the overall operation of the electronic apparatus EA. The power supply module PM may include a conventional battery module.

The first electronic module EM1 and the second electronic module EM2 include various functional modules for operating the electronic apparatus EA. The first electronic module EM1 may be directly mounted on a motherboard electrically connected to the electronic panel 200 or mounted on a separate board to be electrically connected to a motherboard through a connector (not shown).

The first electronic module EM1 may include a control module CM, a wireless communication module TM, an image input module IIM, an audio input module AIM, a memory MM, and an external interface IF. Some of the modules may not be mounted on the motherboard but may be electrically connected to the motherboard through a flexible circuit board.

The control module CM controls the overall operation of the electronic apparatus EA. The control module CM may be a microprocessor. For example, the control module CM activates or deactivates the electronic panel 200. The control module CM may control other modules such as the image input module IIM and the audio input module AIM based on touch signals received from the electronic panel 200.

The wireless communication module TM may transmit/receive wireless signals to/from another terminal using a Bluetooth or a Wi-Fi line. The wireless communication module TM may transmit/receive voice signals using a general communication line. The wireless communication module TM includes a transmission unit TM1 for modulating and transmitting signals to be transmitted, and a reception unit TM2 for demodulating received signals.

The image input module IIM processes image signals and converts the image signals into image data that may be displayed on the electronic panel 200. The audio input module AIM receives external audio signals through a microphone in a recording mode, a voice recognition mode, etc., and converts the signals into electrical voice data.

The external interface IF serves as an interface connected to an external charger, a wired/wireless data port, a card socket (e.g., a memory card, a SIM/UIM card), etc.

The second electronic module EM2 may include an audio output module AOM, a light emitting module LM, a light receiving module LRM, and a camera module CMM. Those components may be directly mounted on a motherboard or be mounted on a separate board to be electrically connected to the electronic panel 200 through a connector (not shown), or electrically connected to the first electronic module EM1.

The audio output module AOM converts the audio data received from the wireless communication module TM or the audio data stored in the memory MM, and outputs the audio data to the outside.

The light emitting module LM generates and outputs light. The light emitting module LM may output infrared rays. The light emitting module LM may include an LED element. The light receiving module LRM may detect infrared rays. The light receiving module LRM may be activated when an infrared ray of a predetermined level or higher is detected. The light receiving module LRM may include a CMOS sensor. After the infrared light generated in the light emitting module LM is output, the infrared light is reflected by external objects (e.g., a user's finger or face), and the reflected infrared light may be incident on the light receiving module LRM. The camera module CMM captures an image of the outside.

The electronic module 300 according to an embodiment of the present invention may include at least any one of the components of the first electronic module EM1 and the second electronic module EM2. For example, the electronic module 300 may include at least any one among a camera, a speaker, a light detection sensor, and a heat detection sensor. The electronic module 300 may detect external subjects received through the hall area HA or provide sound signals such as voice to the outside through the hall area HA. In addition, the electronic module 300 may include a plurality of components, and is not limited to any one embodiment.

Referring back to FIGS. 1A and 1B, the housing unit 400 combines with the window member 100. The housing unit 400 combines with the window member 100 to provide a predetermined interior space. The electronic panel 200 and the electronic module 300 may be accommodated in the interior space.

The housing unit 400 may include a material having relatively higher rigidity. For example, the housing unit 400 may include a plurality of frames and/or plates formed of glass, plastic, or metal, or a combination thereof. The housing unit 400 may stably protect the components of the electronic apparatus EA accommodated in the interior space from external shocks.

According to the present invention, the module hole MH may be provided in the electronic panel 200 for the electronic module 300. Accordingly, an electronic apparatus having a reduced bezel area BZA may be provided.

Figure 3A:
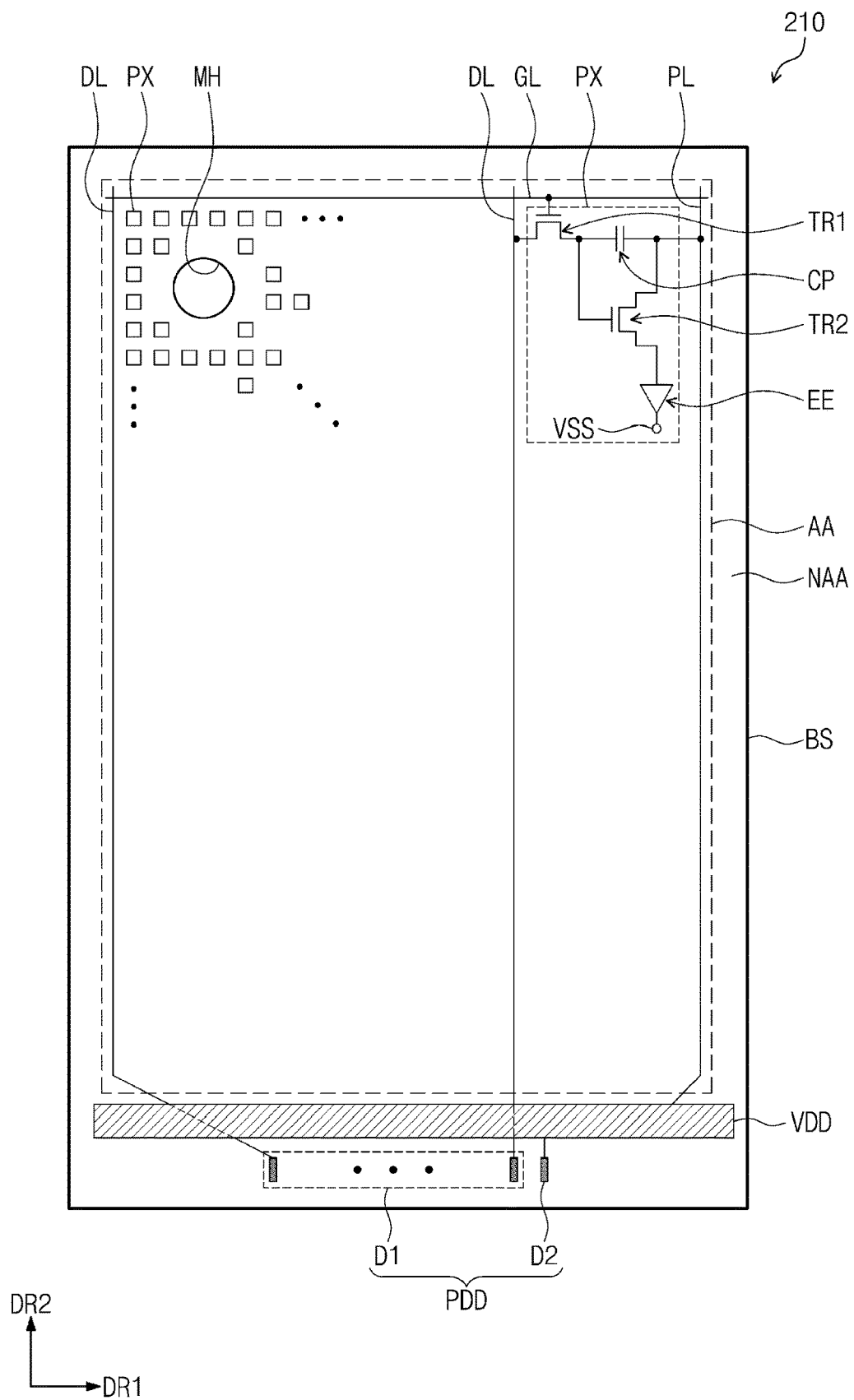
Figure 3B:
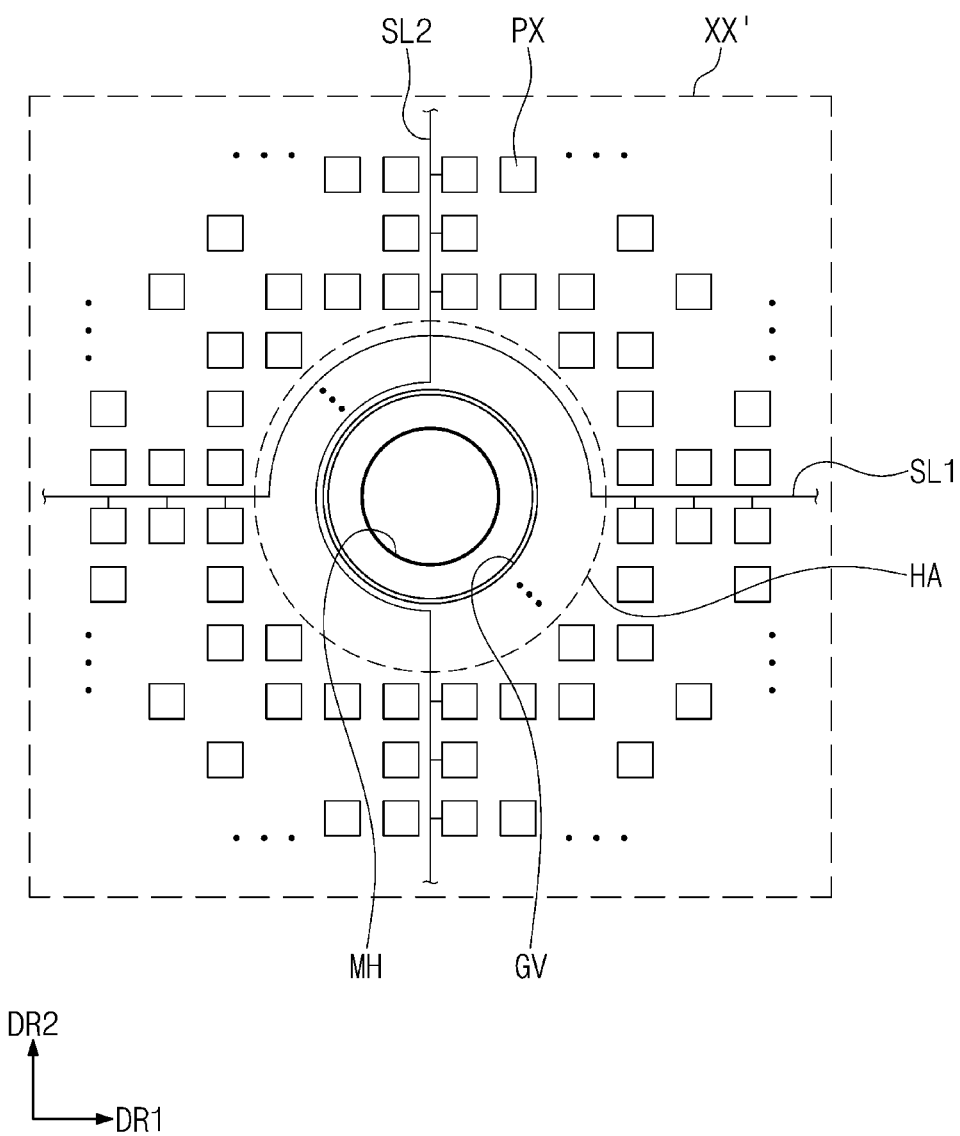
Figure 3C:
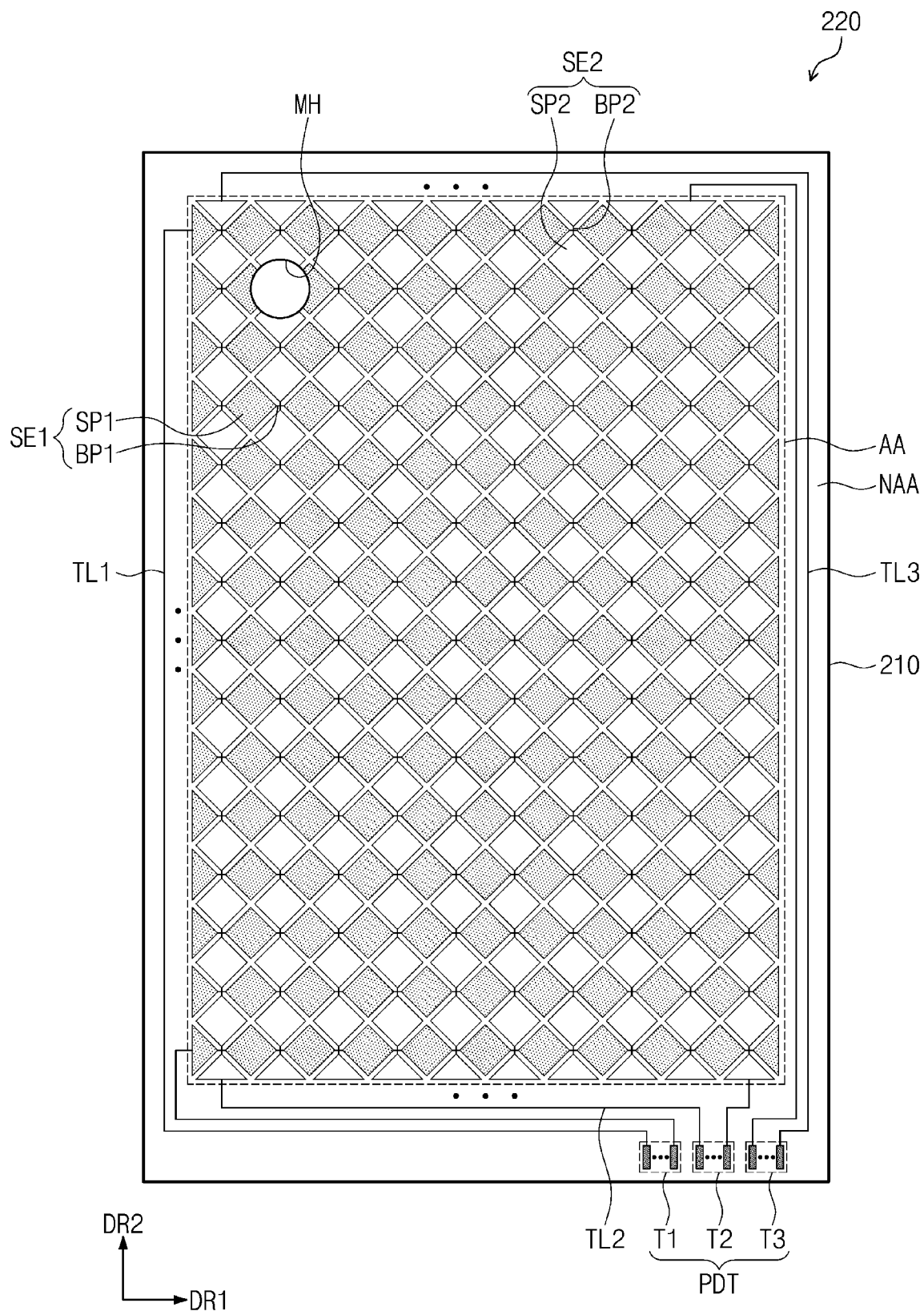

FIG. 3A is a plan view of a display unit according to an embodiment of the present invention. FIG. 3B is a plan view enlarging a portion of FIG. 3A. FIG. 3C is a plan view of a sensing unit according to an embodiment of the present invention. A signal circuit diagram is briefly shown in FIG. 3A, and area XX' shown in FIG. 1B is enlarged and shown in FIG. 3B. In addition, some components are omitted in FIGS. 3A to 3B for the convenience of description. Hereinafter, embodiments of the present invention will be described with reference to FIGS. 3A and 3B.

As shown in FIG. 3A, the display unit 210 includes a base substrate BS, a plurality of pixels PX, a plurality of signal lines GL, DL, and PL, and a plurality of display pads PDD. The active area AA and the peripheral area NAA may be provided by the base substrate BS. The base substrate BS may include an insulating substrate. For example, the base substrate BS may be formed of a glass substrate, a plastic substrate, or a combination thereof.

The signal lines GL, DL, and PL may be connected to the pixels PX to transmit electrical signals to the pixels PX. Among the signal lines included in the display unit 210, a scan line GL, a data line DL, and a power line PL are exemplarily illustrated. However, this is presented as an example, and the signal lines GL, DL, and PL may further include any one among a power line, an initialization voltage line, and a light emitting control line, and are not limited to any one embodiment.

The pixels PX may be disposed in the active area AA. In the present embodiment, a signal circuit diagram of one pixel PX among the plurality of pixels is enlarged and illustrated as an example. The pixel PX may include a first thin film transistor TR1, a capacitor CP, a second thin film transistor TR2, and a light emitting element EE. The first thin film transistor TR1 may be a switching element controlling on-off of the pixel PX. The first thin film transistor TR1 may transmit or block data signals transmitted through the data line DL in response to scan signals transmitted through the scan line GL.

The capacitor CP is connected to the first thin film transistor TR1 and the power line PL. The capacitor CP is charged with an amount of charge corresponding to a difference between a data signal transmitted from the first thin film transistor TR1 and a first power signal applied to the power line PL.

The second thin film transistor TR2 is connected to the first thin film transistor TR1, the capacitor CP, and the light emitting element EE. The second thin film transistor TR2 controls a driving current flowing through the light emitting element EE in response to the amount of charge stored in the capacitor CP. The turn-on time of the second thin film transistor TR2 may be determined according to the amount of charge charged in the capacitor CP. The second thin film transistor TR2 provides the first power signal transmitted through the power line PL to the light emitting element EE during the turn-on time.

The light emitting element EE may generate light according to electrical signals or control the amount of light. For example, the light emitting element EE may include an organic light emitting element, a quantum dot light emitting element, an electrophoretic element, or an electrowetting element.

The light emitting element EE is connected to a power terminal VSS to receive a power signal (hereinafter, referred to as a second power signal) which is different from the first power signal provided from the power line PL. The driving current corresponding to a difference between the electrical signals provided from the second thin film transistor TR2 and the second power signal flows in the light emitting element EE, and the light emitting element EE may generate light corresponding to the driving current. Meanwhile, this is presented as an example, and the pixel PX may include electronic elements having a variety of configurations and arrangements and is not limited to any one embodiment.

In FIG. 3B, for the convenience of description, the hole area HA of the window member 100 (see FIG. 1A) is shown through a dotted line. The area XX' includes an area in which a module hole MH is defined. Hereinafter, the display unit 210 in the area where the module hole MH is disposed will be described with reference to FIG. 3B.

As described above, the module hole MH may be defined in the active area AA. Accordingly, at least some of the pixels PX may be disposed adjacent to the module hole MH. Some of the pixels PX may surround the module hole MH.

Meanwhile, a predetermined depression pattern GV may be defined in the hole area HA. The depression pattern GV is disposed along an edge of the module hole MH on a plane, and in the present embodiment, the depression pattern GV is shown in a circular ring shape surrounding the module hole MH. However, this is presented as an example, and the depression pattern GV may have a different shape from the module hole MH, have a polygonal shape, an oval shape, or a closed line shape including at least some curves, or may be provided in a shape including a plurality of partially disconnected patterns, and is not limited to any one embodiment.

The depression pattern GV corresponds to a portion recessed from the front surface of the display unit 210 and blocks a path through which moisture or oxygen that may penetrate through the module hole MH flows into the pixel PX. Detailed descriptions will be described later.

A plurality of signal lines SL1 and SL2 connected to the pixels PX may be disposed in the hole area HA. The signal lines SL1 and SL2 are connected to the pixels PX through the hole area HA. FIG. 3B illustrates, as an example, a first signal line SL1 and a second signal line SL2 among a plurality of signal lines connected to the pixels PX for the convenience of description.

The first signal line SL1 extends along the first direction DR1. The first signal line SL1 is connected to the pixels in the same row arranged along the first direction DR1 among the pixels PX. The first signal line SL1 is exemplarily described to correspond to a scan line GL.

Some of the pixels connected to the first signal line SL1 are disposed on the left side of the module hole MH, and some others are disposed on the right side of the module hole MH. Accordingly, the pixels in the same row connected to the first signal line SL1 may be turned on/off through substantially the same gate signal even when some of the pixels are omitted around the module hole MH.

The second signal line SL2 extends along the second direction DR2. The second signal line SL2 is connected to the pixels in the same column arranged along the second direction DR2 among the pixels PX. The second signal line SL2 is exemplarily described to correspond to the data line DL.

Some of the pixels connected to the second signal line SL1 are disposed above the module hole MH, and some others are disposed below the module hole MH. Accordingly, the pixels in the same column connected to the second signal line SL2 may receive data signals through the same line even when some of the pixels are omitted around the module hole MH.

Meanwhile, the electronic panel 200 according to an embodiment of the present invention may further include a connection pattern disposed in the hole area HA. In this case, the first signal line SL1 may be disconnected in an area overlapping the hole area HA. The disconnected portions of the first signal line SL may be connected through the connection pattern. Similarly, the second signal line SL2 may be disconnected in an area overlapping the hole area HA, and a connection pattern may be further provided to connect the disconnected portions of the second signal line.

Referring back to FIG. 3A, a power pattern VDD is disposed in the peripheral area NAA. In the present embodiment, the power pattern VDD is connected to a plurality of power lines PL. Accordingly, the display unit 210 includes the power pattern VDD, and may thus provide the same first power signal to the plurality of pixels.

The display pads PDD may include a first pad D1 and a second pad D2. The first pads D1 may be provided in plurality to be respectively connected to the data lines DL. The second pad D2 may be connected to the power pattern VDD to be electrically connected to the power line PL. The display unit 210 may provide electrical signals provided from the outside to the pixels PX through the display pads PDD. Meanwhile, the display pads PDD may further include pads for receiving electrical signals in addition to the first pad D1 and the second pad D2, and are not limited to any one embodiment.

Referring to FIG. 3C, the sensing unit 220 is disposed on the display unit 210. The sensing unit 220 may detect the external input TC (see FIG. 1A) to obtain information on the location or intensity of the external input TC. The sensing unit 220 includes a plurality of first sensing electrodes SE1, a plurality of second sensing electrodes SE2, a plurality of sensing lines TL1, TL2, and TL3, and a plurality of sensing pads TPD.

The first sensing electrodes SE1 and the second sensing electrodes SE2 are disposed in the active area AA. The sensing unit 220 may obtain information on the external input TC through changes in capacitance between the first sensing electrodes SE1 and the second sensing electrodes SE2.

The first sensing electrodes SE1 each extend along the first direction DR1 and are arranged along the second direction DR2. The first sensing electrodes SE1 may include a plurality of first sensing patterns SP1 and a plurality of first connection patterns CP1.

The first sensing patterns SP1 forming one first sensing electrode are arranged to be spaced apart from each other along the first direction DR1. For the convenience of description in the present embodiment, the first sensing patterns SP1 are shaded to be illustrated. The first connection patterns CP1 are disposed between the first sensing patterns SP1 to connect two adjacent first sensing patterns SP1.

The second sensing electrodes SE2 each extend along the second direction DR2 and are arranged along the first direction DR1. The second sensing electrodes SE2 may include a plurality of second sensing patterns SP2 and a plurality of second connection patterns CP2.

The second sensing patterns SP2 forming one second sensing electrode are arranged to be spaced apart from each other along the second direction DR2. The second connection patterns CP2 are disposed between the second sensing patterns SP2 to connect two adjacent second sensing patterns SP1.

The sensing lines TL1, TL2, and TL3 are disposed in the peripheral area NAA. The sensing lines TL1, TL2, and TL3 may include first sensing lines TL1, second sensing lines TL2, and third sensing lines TL3. The first sensing lines TL1 are respectively connected to the first sensing electrodes SE1. The second sensing lines TL2 are respectively connected to one ends of the second sensing electrodes.

The third sensing lines TL3 are respectively connected to the other ends of the second sensing electrodes SE2. The other ends of the second sensing electrodes may be portions facing one ends of the second sensing electrodes SE2. According to the present invention, the second sensing electrodes SE2 may be connected to the second sensing lines TL2 and the third sensing lines TL3. Accordingly, for the second sensing electrodes SE2 having a relatively greater length than the first sensing electrodes SE1, sensitivity according to areas may stay even. Meanwhile, this is presented as an example, and the third sensing lines TL3 may be omitted, and are not limited to any one embodiment.

The sensing pads TPD are disposed in the peripheral area NAA. The sensing pads TPD may include first sensing pads T1, second sensing pads T2, and third sensing pads T3. The first sensing pads T1 are respectively connected to the first sensing lines TL1 to provide external signals to the first sensing electrodes SE1. The second sensing pads T2 are respectively connected to the second sensing lines TL2 and the third sensing pads T3 are respectively connected to the third sensing lines TL3 to be electrically connected to the second sensing electrodes SE2.

Meanwhile, the module hole MH is defined in the sensing unit 220 as well. The module hole MH is defined in the active area AA, and a portion of the first sensing electrodes SE1 overlapping the module hole MH and a portion of the second sensing electrodes SE2 overlapping the module hole MH may thus be disconnected and removed. Accordingly, an issue of the module hole MH being covered by the first sensing electrode SE1 or the second sensing electrode SE2 may be prevented.

Figure 4A:
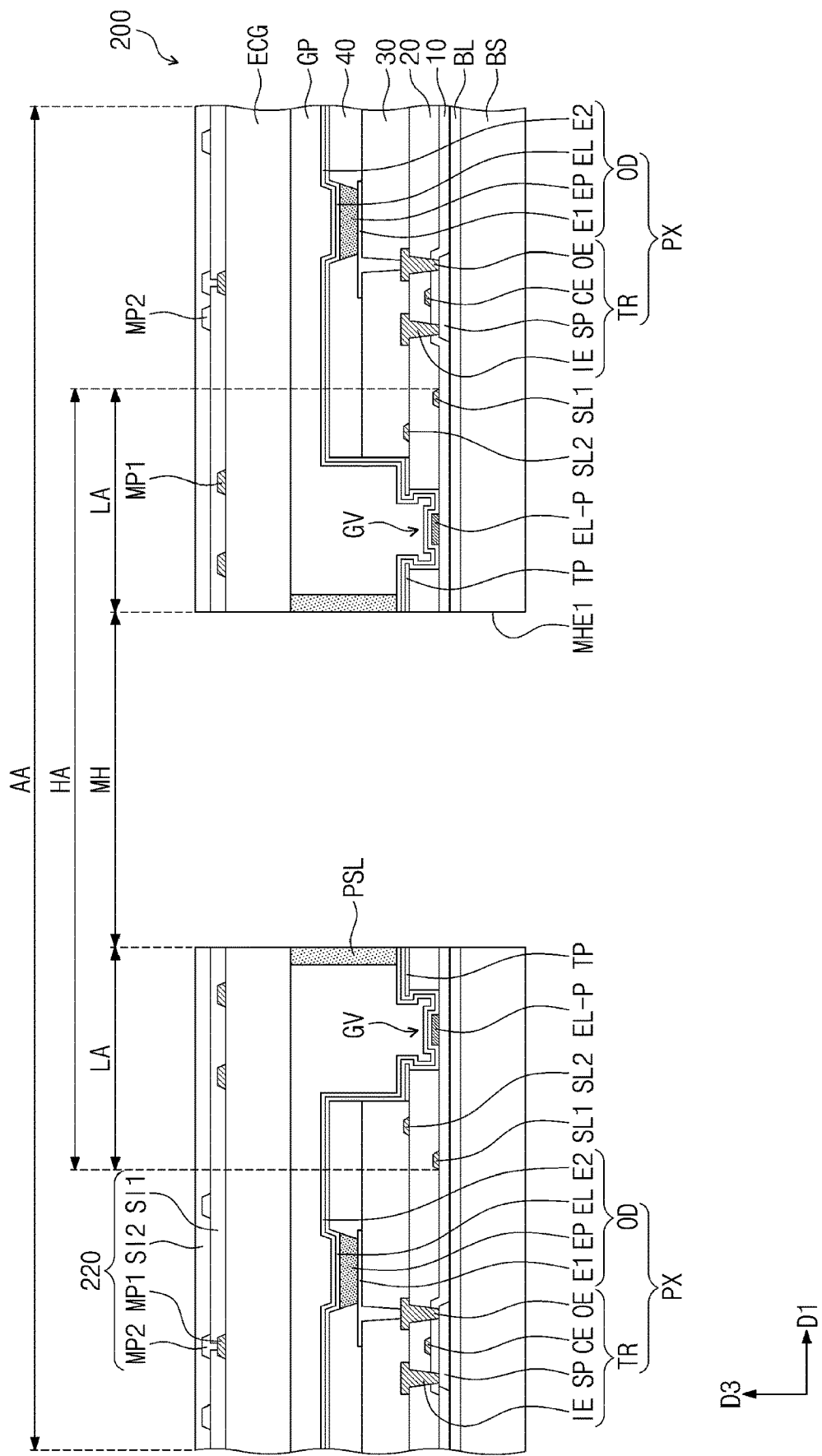
Figure 4B:
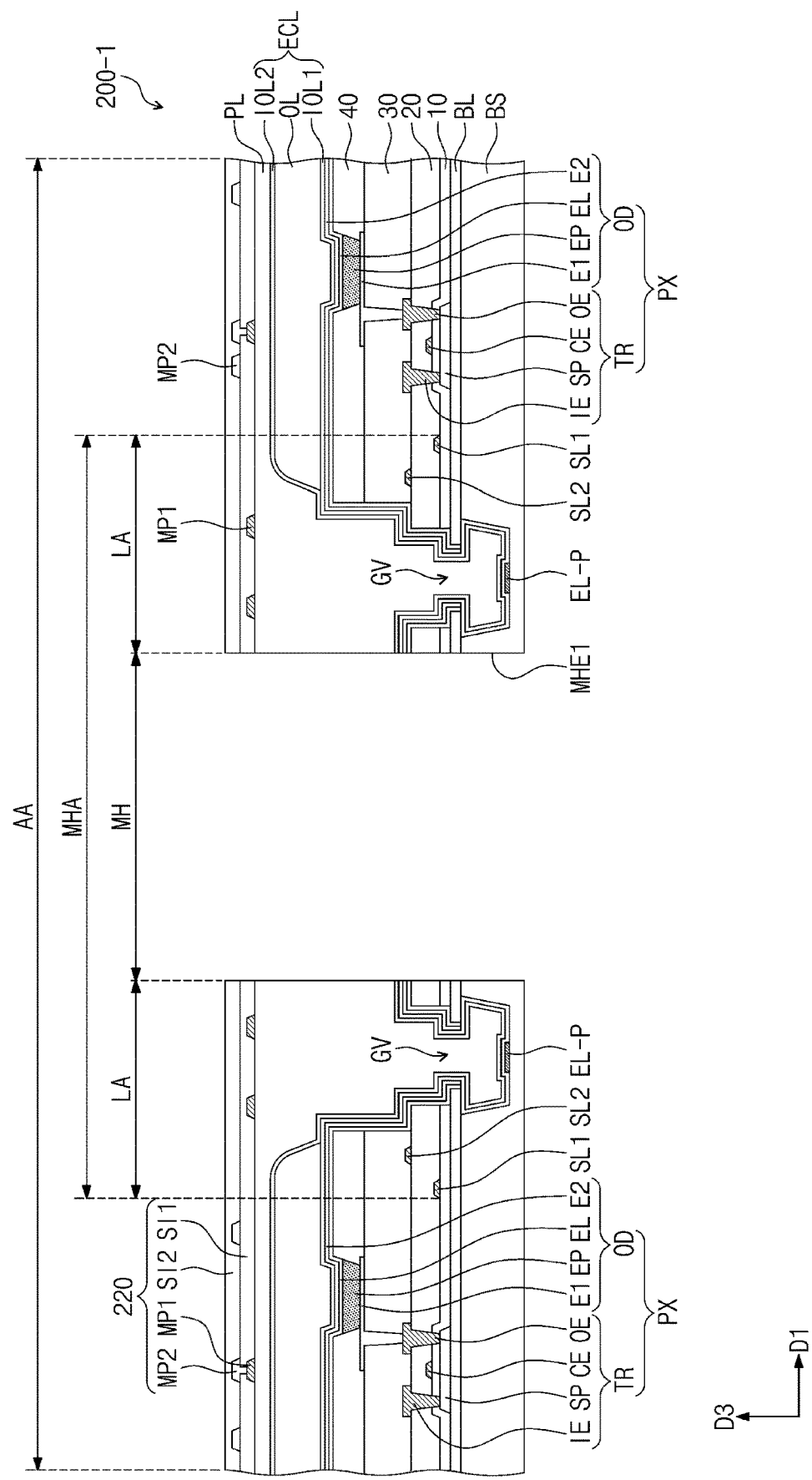

FIGS. 4A and 4B are cross-sectional views illustrating a portion of an electronic apparatus according to an embodiment of the present invention. FIG. 4A is a cross-sectional view of an area in which a module hole MH of the electronic panel 200 shown in FIG. 1B is defined, and FIG. 4B is a cross-sectional view of an electronic panel 200-1 according to an embodiment of the present invention. For the convenience of description, FIG. 4B illustrates an area corresponding to FIG. 4A. Hereinafter, embodiments of the present invention will be described with reference to FIGS. 4A and 4B. Meanwhile, the same reference numerals are applied to the same configurations as those described in FIGS. 1A to 3C, and redundant descriptions will be omitted.

As shown in FIG. 4A, the electronic apparatus includes a base substrate BS, an auxiliary layer BL, a pixel PX, a plurality of insulating layers 10, 20, 30, and 40, an encapsulation substrate ECG, and a sensing unit 220.

The base substrate BS may be an insulating substrate. For example, the base substrate BS may include a plastic substrate or a glass substrate. The auxiliary layer BL is disposed on the base substrate BS to cover an overall surface of the base substrate BS. The auxiliary layer BL includes an inorganic material. The auxiliary layer BL may include a barrier layer and/or a buffer layer. Accordingly, the auxiliary layer BL may prevent oxygen or moisture introduced through the base substrate BS from penetrating into the pixel PX, or reduce the surface energy of the substrate BS to allow the pixel PX to be stably formed on the base substrate BS.

The pixel PX may be disposed in the active area AA. In the present embodiment, for the pixel PX, among the components of the equivalent circuit diagram of the pixel PX shown in FIG. 3A, a second thin film transistor TR (hereinafter, a thin film transistor) and a light emitting element EE (hereinafter, OD) are illustrated as examples. The first to fourth insulating layers 10, 20, 30, and 40 each may include an organic material and/or an inorganic material, and may have a single layer or a stack structure.

The thin film transistor TR includes a semiconductor pattern SP, a control electrode CE, an input electrode IE, and an output electrode OE. The semiconductor pattern SP is disposed on the auxiliary layer BL. The semiconductor pattern SP may include semiconductor materials. The control electrode CE is spaced apart from the semiconductor pattern SP with the first insulating layer 10 therebetween. The control electrode CE may be connected to one electrode of the first thin film transistor TR1 (see FIG. 3A) and the capacitor CP (see FIG. 3A) described above.

The input electrode IE and the output electrode OE are spaced apart from the control electrode CE with the second insulating layer 20 therebetween. The input electrode IE and the output electrode OE of a pixel transistor TR-P pass through the first insulating layer 10 and the second insulating layer 20 to be respectively connected to one side and the other side of the semiconductor pattern SP.

The third insulating layer 30 is disposed on the second insulating layer 20 to cover the input electrode IE and the output electrode OE. Meanwhile, in the thin film transistor TR, the semiconductor pattern SP may be disposed on the control electrode CE. Alternatively, the semiconductor pattern SP may be disposed on the input electrode IE and the output electrode OE. Alternatively, the input electrode IE and the output electrode OE may be disposed on the same layer as the semiconductor pattern SP to be directly connected to the semiconductor pattern SP. The thin film transistor TR according to an embodiment of the present invention may be formed in various structures, and is not limited to any one embodiment.

The light emitting element OD is disposed on the third insulating layer 30. The light emitting element OD includes a first electrode E1, a light emitting pattern EP, an organic layer EL, and a second electrode E2.

The first electrode E1 may pass through the third insulating layer 30 to be connected to the thin film transistor TR. Meanwhile, although not shown, the electronic panel 200 may further include a separate connection electrode disposed between the first electrode E1 and the thin film transistor TR, and in this case, the first electrode E1 may be electrically connected to the thin film transistor TR through the connection electrode.

The fourth insulating layer 40 is disposed on the third insulating layer 30. The fourth insulating layer 40 may include an organic material and/or an inorganic material, and may have a single layer or a stack structure. An opening may be defined in the fourth insulating layer 40. The opening exposes at least a portion of the first electrode E1. The fourth insulating layer 40 may be a pixel defining film.

The light emitting pattern EP is disposed in the opening to be disposed on the first electrode E1 exposed by the opening. The light emitting pattern EP may include a light emitting material. For example, the light emitting pattern EP may be formed of at least any one of materials emitting red, green, and blue, and may include a fluorescent material or a phosphorescent material. The light emitting pattern EP may include an organic light emitting material or an inorganic light emitting material. The light emitting pattern EP may emit light in response to a potential difference between the first electrode E1 and the second electrode E2.

The control layer EL is disposed between the first electrode E1 and the second electrode E2. The control layer EL is disposed adjacent to the light emitting pattern EP. The control layer EL controls the movement of electric charges to improve luminous efficiency and lifespan of the light emitting element OL. The control layer EL may include at least any one among a hole transport material, a hole injection material, an electron transport material, and an electron injection material.

In the present embodiment, the control layer EL is shown to be disposed between the light emitting pattern EP and the second electrode E2. However, this is presented as an example, and the control layer EL may be disposed between the light emitting pattern EP and the first electrode E1, and may be provided as a plurality of layers stacked along the third direction DR3 with the light emitting pattern EP therebetween.

The control layer EL may have a single body shape extending from the active area AA to the peripheral area NAA. The control layer EL may be commonly provided to a plurality of pixels.

The second electrode E2 is disposed on the light emitting pattern EP. The second electrode E2 may face the first electrode E1. The second electrode E2 may have a single body shape extending from the active area AA to the peripheral area NAA. The second electrode E2 may be commonly provided to a plurality of pixels. The light emitting element OD each disposed in each of the pixels receives a common power voltage (hereinafter, a second power voltage) through the second electrode E2.

The second electrode E2 may include a transmissive conductive material or a transflective conductive material. Accordingly, light generated in the light emitting pattern EP may be easily emitted towards the third direction DR3 through the second electrode E2. However, this is presented as an example, and in the light emitting device OD according to an embodiment of the present invention, the first electrode E1 may be operated through a bottom-emission method including a transmissive or transflective material, or may be operated through a dual-emission method that emits light towards both front and rear surfaces, and is not limited to any one embodiment.

The encapsulation substrate ECG may include an insulating material. For example, the encapsulation substrate ECG may include a glass substrate or a plastic substrate. The optical member OP described above may be disposed on the encapsulation substrate ECG. The display panel DP according to an embodiment of the present invention includes the encapsulation substrate ECG, and may thus have improved reliability against external shocks.

The encapsulation substrate ECG may be disposed to be spaced apart from the second electrode E2 by a predetermined interval in the third direction D3. A gap GP between the encapsulation substrate ECG and the second electrode E2 may be filled with air or an inert gas.

The encapsulation substrate ECG combines with the base substrate BS through a sealing member PSL, and seals the pixel PX. The encapsulation substrate ECG may be disposed on the base substrate BS by a predetermined interval through the sealing member PSL.

The sealing member PSL may be one component defining an inner surface of the module hole MH. The sealing member PSL may include an organic material such as a photocurable resin or a photoplastic resin, or may include an inorganic material such as a frit seal, and is not limited to any one embodiment.

The sensing unit 220 is disposed on the encapsulation substrate ECG. The sensing unit 220 includes a first conductive pattern MP1, a second conductive pattern MP2, a first sensing insulating layer SI1, and a second sensing insulating layer SI2.

The first conductive pattern MP1 is disposed on the encapsulation substrate ECG. The first conductive pattern MP1 may be directly formed on the encapsulation substrate ECG. However, this is presented as an example, and a protection layer may be further disposed between the first conductive pattern MP1 and the encapsulation substrate ECG.

The first conductive pattern MP1 includes conductive materials. For example, the first conductive pattern MP1 may include a metal, a conductive oxide, a conductive polymer, or a combination thereof.

The second conductive pattern MP2 is disposed on the first conductive pattern MP1. The second conductive pattern MP2 includes conductive materials. For example, the second conductive pattern MP2 may include a metal, a conductive oxide, a conductive polymer, or a combination thereof.

The first sensing insulating layer SI1 is disposed between the first conductive pattern MP1 and the second conductive pattern MP2. The second sensing insulating layer SI2 is disposed on the first sensing insulating layer SI1 to cover the second conductive pattern MP2. In the present embodiment, some of the second conductive patterns MP2 may pass through the first sensing insulating layer SI1 to be connected to some of the first conductive patterns MP1.

The first conductive pattern MP1 and the second conductive pattern MP2 may form the first sensing electrode SE1 (see FIG. 3C) and the second sensing electrode SE2 (see FIG. 3C) shown in FIG. 3C. For example, the first conductive pattern MP1 may form the second connection pattern CP22 (see FIG. 3C), and the second conductive pattern MP2 may form the first sensing electrode SE1 (see FIG. 3C) and the second sensing pattern SP2 (see FIG. 3C). However, this is presented as an example, and the first conductive pattern MP1 may form the first sensing electrode SE1 and the second conductive pattern MP2 may form the second sensing electrode SE2, or the first conductive pattern MP1 may form the first sensing electrode SE1 and the second sensing pattern SP2, and the second conductive pattern MP2 may form the second connection pattern CP22, and the embodiment of the present invention is not limited to any one.

The module hole MH passes through the electronic panel 200. In the present embodiment, an inner surface MHE1 of the module hole MH may be defined by cross sections of the base substrate BS, the auxiliary layer BL, the first insulating layer 10, the sealing member PSL, the encapsulation substrate ECG, the first sensing insulating layer SI1, and the second sensing insulating layer SI2.

Meanwhile, as shown in FIG. 4B, the electronic panel 200-1 may include an encapsulation layer ECL. The encapsulation layer ECL is disposed on the display element OD to encapsulate the display element OD. The encapsulation layer ECL may be commonly provided to a plurality of pixels. Meanwhile, although not shown, a capping layer covering the second electrode E2 may be further disposed between the second electrode E2 and the encapsulation layer ECL.

The encapsulation layer ECL may include a first inorganic layer IOL1, an organic layer OL, and a second inorganic layer IOL2, which are sequentially stacked along the third direction D3. However, the embodiment of the present invention is not limited thereto, and the encapsulation layer ECL may further include a plurality of inorganic layers and organic layers.

The first inorganic layer IOL1 may cover the second electrode E2. The first inorganic layer IOL1 may prevent external moisture or oxygen from penetrating into the display element OD. For example, the first inorganic layer IOL1 may include silicon nitride, silicon oxide, or a combination thereof. The first inorganic layer IOL1 may be formed through a deposition process.

The organic layer OL may be disposed on the first inorganic layer IOL1 to contact the first inorganic layer IOL1. The organic layer OL may provide a flat surface on the first inorganic layer IOL1. Unevenness formed on an upper surface of the first inorganic layer IOL1 or particles present on the first inorganic layer IOL1 may be covered by the organic layer OL to prevent the surface state of the upper surface of the first inorganic layer IOL1 from affecting the components formed on the organic layer OL. In addition, the organic layer OL may relieve stress between layers in contact with each other. The organic layer OL may include organic materials and be formed through solution processes such as spin coating, slit coating, or an inkjet process.

The second inorganic layer IOL2 is disposed on the organic layer OL to cover the organic layer OL. The second inorganic layer IOL2 may be stably formed on a relatively flat surface compared to being disposed on the first inorganic layer TOLL The second inorganic layer IOL2 encapsulates moisture released from the organic layer OL to prevent the moisture from entering the outside. The second inorganic layer IOL2 may include silicon nitride, silicon oxide, or a combination thereof. The second inorganic layer IOL2 may be formed through a deposition process.

A planarization layer PL may be disposed on the encapsulation layer ECL. The planarization layer PL covers an overall surface of the encapsulation layer ECL providing an uneven surface to provide a flat surface to the active area AA. The sensing unit 220 may be disposed on the planarization layer PL. In the present embodiment, the inner surface MHE1 of the module hole MH may be defined by cross sections of the base substrate BS, the auxiliary layer BL, the first insulating layer 10, the sealing member PSL, the encapsulation substrate ECG, the first sensing insulating layer SI1, and the second sensing insulating layer SI2.

Meanwhile, in the electronic panel 200-1 according to the present embodiment, a depression pattern GV may be formed in the hole area HA. The depression pattern GV is a pattern recessed from a front surface of the electronic panel 200-1, and may be formed by removing some of the components of the electronic panel 200-1. Meanwhile, unlike the module hole MH, the depression pattern GV does not pass through the electronic panel 200-1. Accordingly, a rear surface of the base substrate BS overlapping the depression pattern GV is not opened by the depression pattern GV.

In the present embodiment, the base substrate BS may have flexibility. For example, the base substrate BS may include a resin such as polyimide.

The depression pattern GV may be formed by leaving only a portion of the base substrate BS and penetrating the components adjacent to the module hole MH among the remaining components disposed below the encapsulation layer ECL. In the present embodiment, the depression pattern GV may be formed by connecting a through portion formed in the auxiliary layer BL and a depression portion formed in the base substrate BS. The inner surface of the depression pattern GV may be formed when the through portion formed in the auxiliary layer BL and the depression portion formed in the base substrate BS are covered by the first inorganic layer IOL1 and the second inorganic layer IOL2. In the present embodiment, the inner surface of the depression pattern GV may be provided by the second inorganic layer IOL2.

Meanwhile, the depression pattern GV may have an undercut shape including a tip portion TP protruding towards an inner side. In the present embodiment, the tip portion TP may be formed such that a portion of the auxiliary layer BL protrudes greater than the base substrate BS to an inner side of the depression pattern GV. Meanwhile, the electronic panel 200-1 according to an embodiment of the present invention may have various layer structures as long as the tip portion TP is formed in the depression pattern GV, and is not limited to any one embodiment.

Meanwhile, the electronic panel 200-1 may further include a predetermined organic pattern EL-P disposed in the depression pattern GV. The organic pattern EL-P may include the same material as the control layer EL. Alternatively, the organic pattern EL-P may include the same material as the second electrode E2 or a capping layer (not shown). The organic pattern EL-P may have a single-layer or multi-layer structure.

The organic pattern EL-P may be spaced apart from the control layer EL and the second electrode E2 to be disposed in the depression pattern GV. The organic pattern EL-P may be covered by the first inorganic layer IOL1 to be prevented from being exposed to the outside.

According to the present invention, the depression pattern GV blocks continuity of the control layer EL connected from the side of the module hole MH to the active area AA. The control layer EL may be disconnected in an area overlapping the depression pattern GV. The control layer EL may be a path in which external contamination such as moisture or air travels. The path through which moisture or air that may be introduced from a layer exposed by the module hole MH, for example, the control layer EL, passes through the hole area MHA and flows into the pixel PX may be blocked through the depression pattern GV. Accordingly, reliability of the electronic panel 200-1 in which the module hole MH is formed may be improved.

Meanwhile, in the electronic panel 200-1 according to an embodiment of the present invention, the depression patterns GV may be provided in plurality arranged to be spaced apart from each other in a wiring area LA. Alternatively, the depression pattern GV may be filled by a portion of the organic layer OL. Alternatively, in the display panel DP according to an embodiment of the present invention, the depression pattern GV may be omitted, and is not limited to any one embodiment.

Figure 5A:
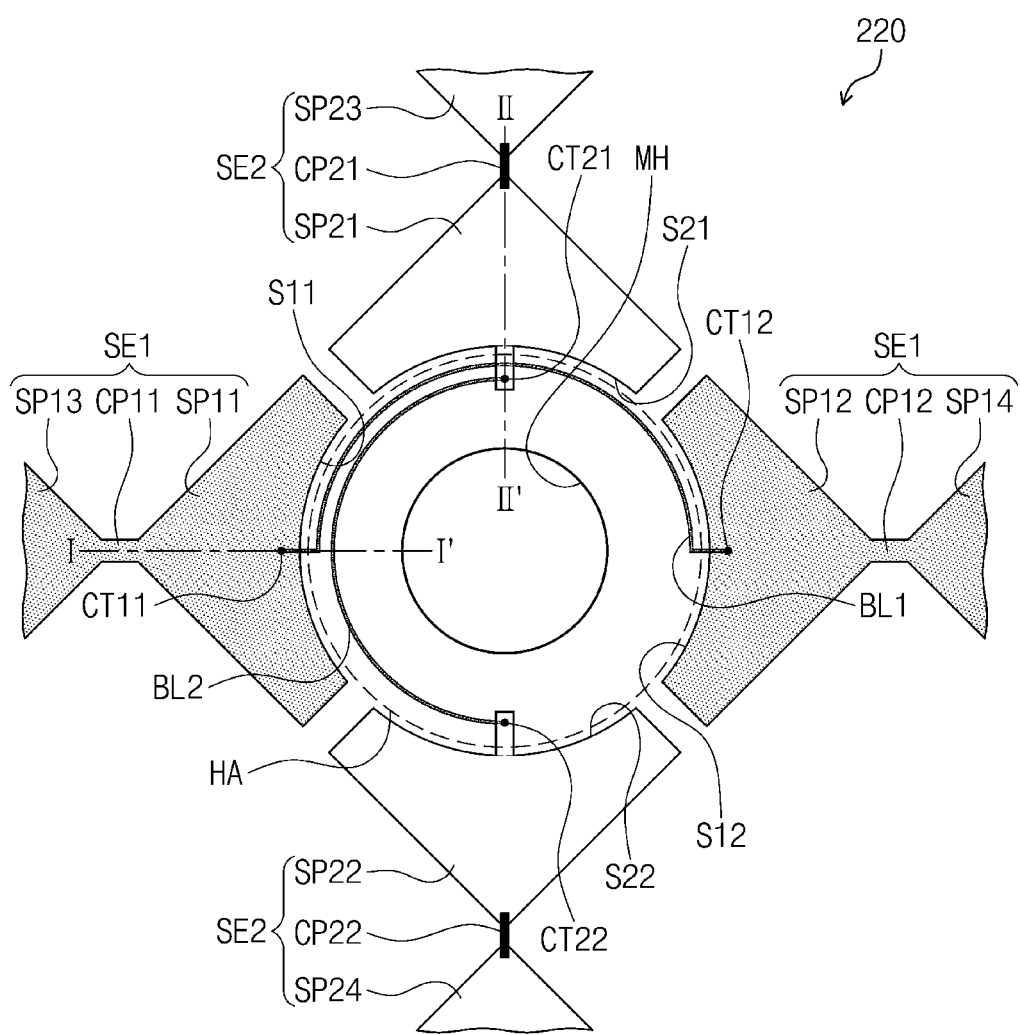
Figure 5B:
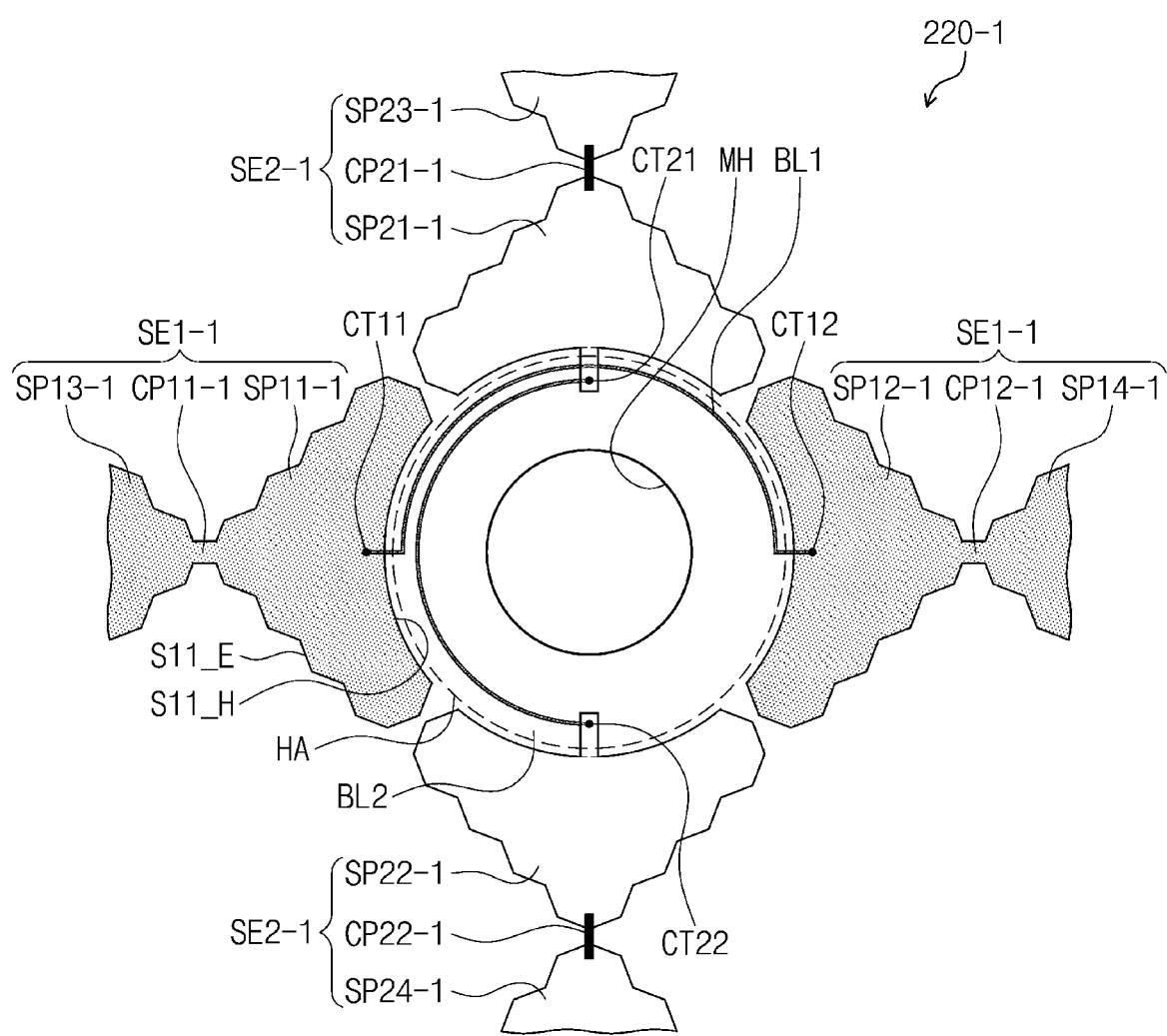
Figure 5C:
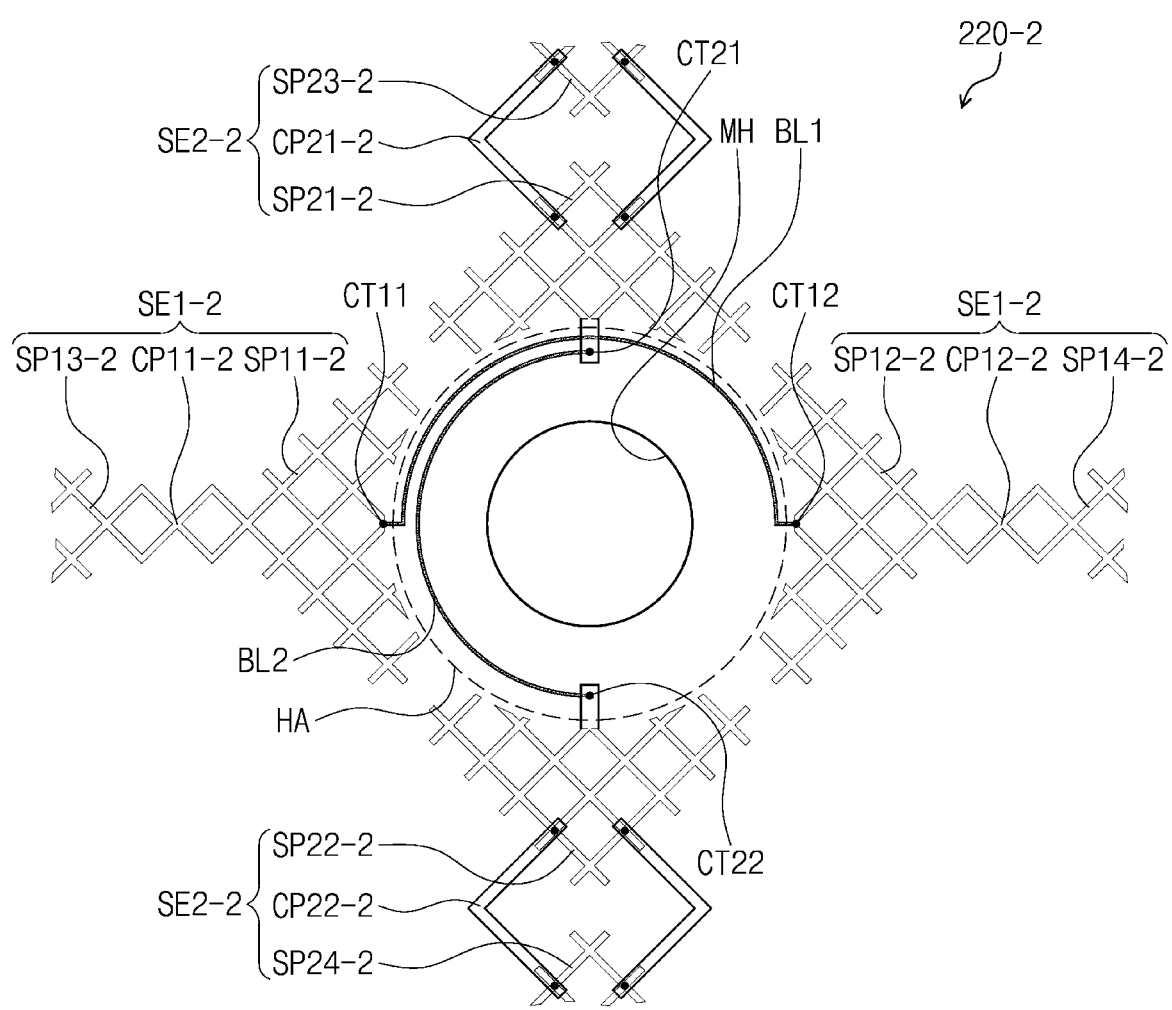
Figure 6A:
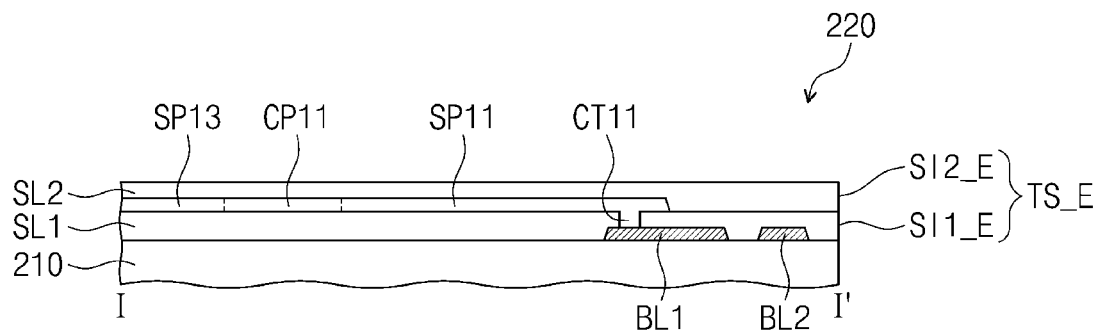
Figure 6B:
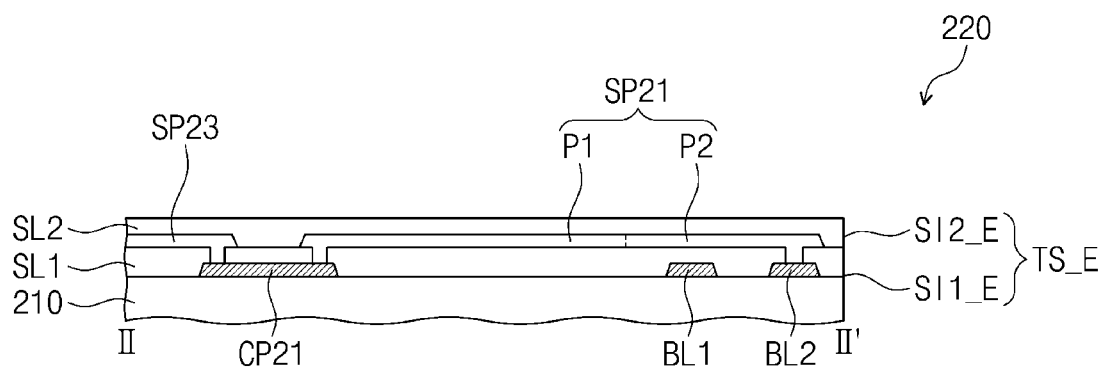
Figure 6C:
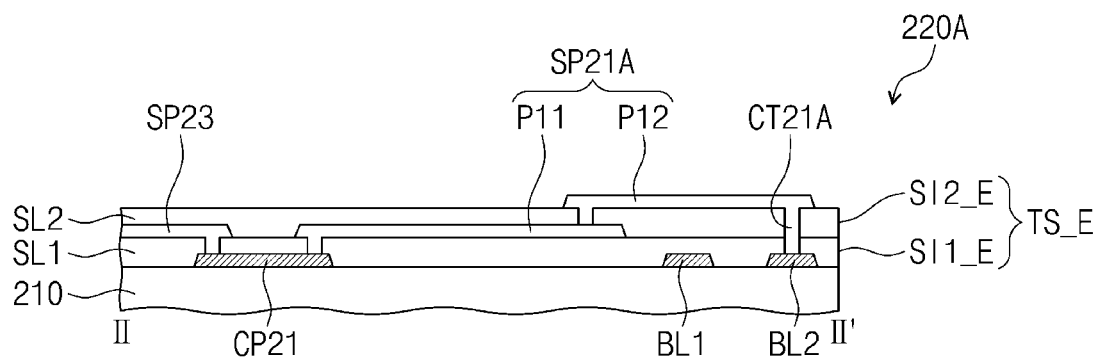

FIGS. 5A to 5C are plan views illustrating a portion of a sensing unit according to an embodiment of the present invention. FIGS. 6A to 6C are cross-sectional views illustrating a portion of a sensing unit according to an embodiment of the present invention. FIGS. 5A to 5C illustrate an area in which a module hole MH is defined. FIG. 6A illustrates a cross-section taken along line I-I' shown in FIG. 5A, FIG. 6B illustrates a cross-section taken along II-IT shown in FIG. 5A, and FIG. 6C illustrates an area corresponding to FIG. 6B. Hereinafter, embodiments of the present invention will be described with reference to FIGS. 5A to 6C.

As shown in FIG. 5A, the module hole MH may be surrounded by some of the sensing electrodes. Some of the sensing electrodes may be adjacent to the module hole MH to have a shape in which a portion is cut.

To be specific, FIG. 5A exemplarily illustrates, among the first sensing electrodes SE1, row sensing patterns SP11, SP12, SP13 and SP14, row connection patterns CP11 and CP12, and a first connection line BL1, and illustrates, among the second sensing electrodes SE2, column sensing patterns SP21, SP22, SP23, and SP24, column connection patterns CP21 and CP22, and a second connection line BL2.

The row sensing patterns SP11, SP12, SP13, and SP14 include first to fourth row sensing patterns SP11, SP12, SP13, and SP14. The first row sensing pattern SP11 and the second row sensing pattern SP12 may be disposed to be spaced apart from each other with the module hole MH therebetween. The first row sensing pattern SP11 is disposed at the left side based on the module hole MH, and the second row sensing pattern SP12 is disposed at the right side based on the module hole MH. The first row sensing pattern SP11 and the second row sensing pattern SP12 include sides facing each other. The sides may include a curve extending along the module hole MH.

The row connection patterns CP11 and CP12 connect adjacent row sensing patterns among the row sensing patterns SP11, SP12, SP13, and SP14. In the present embodiment, the row connection patterns CP11 and CP12 include a first row connection pattern CP11 and a second row connection pattern CP12. The first row connection pattern CP11 is connected to the other side facing one side of the first row sensing pattern SP11 to connect the first row sensing pattern SP11 and the third row sensing pattern SP13. The second row connection pattern CP12 is connected to the other side facing one side of the second row sensing pattern SP12 to connect the second row sensing pattern SP12 and the fourth row sensing pattern SP14.

The first connection line BL1 may be disposed to overlap the hole area HA. The first connection line BL1 includes a curve extending along a portion of the module hole MH. The first connection line BL1 connects one side of the first row sensing pattern SP11 and one side of the second row sensing pattern SP12.

One end of the first connection line BL1 may be connected to the first row sensing pattern SP11 through a first row contact portion CT11. The other end of the first connection line BL1 may be connected to the second row sensing pattern SP12 through a second row contact portion CT12. Detailed descriptions of the first connection line BL1 will be described later.

The column sensing patterns SP21, SP22, SP23, and SP24 include first to fourth column sensing patterns SP21, SP22, SP23, and SP24. The first column sensing pattern SP21 and the second column sensing pattern SP22 may be disposed to be spaced apart from each other with the module hole MH therebetween. The first column sensing pattern SP21 is disposed at an upper side based on the module hole MH, and the second column sensing pattern SP22 is disposed at a lower side based on the module hole MH. The first column sensing pattern SP21 and the second column sensing pattern SP22 include sides facing each other. The sides may include a curve extending along the module hole MH.

The column connection patterns CP21 and CP22 connect adjacent column sensing patterns among the column sensing patterns SP21, SP22, SP23, and SP24. In the present embodiment, the column connection patterns CP21 and CP22 include a first column connection pattern CP21 and a second column connection pattern CP22. The first column connection pattern CP21 is connected to the other side facing one side of the first column sensing pattern SP21 to connect the first column sensing pattern SP21 and the third column sensing pattern SP23. The second column connection pattern CP22 is connected to the other side facing to one side of the second column sensing pattern SP22 to connect the second column sensing pattern SP22 and the fourth column sensing pattern SP24.

The second connection line BL2 may be disposed to overlap the hole area HA. The second connection line BL2 includes a curve extending along a portion of the module hole MH. In the present embodiment, the second connection line BL2 is illustrated to has a semicircular shape. The second connection line BL2 connects one side of the first column sensing pattern SP21 and one side of the second column sensing pattern SP22.

One end of the second connection line BL2 may be connected to the first column sensing pattern SP21 through a first column contact portion CT21. The other end of the second connection line BL2 may be connected to the second column sensing pattern SP22 through a second column contact portion CT22.

In the present embodiment, the first connection line BL1 and the second connection line BL2 may be disposed to be spaced apart from each other on a plane. The first connection line BL1 and the second connection line BL2 non-overlap each other on a plane.

The first connection line BL1 may include at least a curve. The curved portion of the first connection line BL1 overlaps the inside of the hole area HA and is spaced apart from the sensing patterns SP11, SP12, SP13, SP14, SP21, SP22, SP23, and SP24 on a plane.

One end and the other end of the first connection line BL1 may extend to an outer side of the hole area HA to be connected to the first row sensing pattern SP11 or the second row sensing pattern SP12. To be specific, one end of the first connection line BL1 extends to an outer side of the hole area HA to overlap the first row sensing pattern SP11 on a plane. The first row contact portion CT11 may be defined in an area where one end of the first connection line BL1 and the first row sensing pattern SP11 overlap.

The other end of the first connection line BL1 extends to an outer side of the hole area HA to overlap the second row sensing pattern SP12 on a plane. The second row contact portion CT12 may be defined in an area where the other end of the first connection line BL1 and the second row sensing pattern SP12 overlap.

Referring to FIG. 6A, the first row sensing pattern SP11 and the first connection line BL1 are disposed on different layers. The first row contact portion CT11 passes through the first sensing insulating layer SI1 to connect the first row sensing pattern SP11 disposed on the first sensing insulating layer SI1 and the first connection line BL1 disposed below the first sensing insulating layer SI1.

As described above, the module hole MH passes through the display unit 210 and the sensing unit 220. Accordingly, one end SI1_E of the first sensing insulating layer SI1 and one end SI2_E of the second sensing insulating layer SI2 may define an inner surface TS_E of the module hole MH formed in the sensing unit 220.

In the present embodiment, the first connection line BL1 and the second connection line BL2 are disposed on the same layer. The first connection line BL1 and the second connection line BL2 are disposed to be spaced apart from each other on a plane. According to the embodiment of the present invention, the first connection line BL1 extends from the hole area HA to an area overlapping the first row sensing pattern SP11 to be stably in contact with the first row sensing pattern SP11 through the first row connection portion CT11.

The first and second row connection patterns CP11 and CP12 are disposed on the same layer as the row sensing patterns SP11, SP12, SP13, and SP14. The present embodiment illustrates that the first row connection pattern CP11 forms a single body with the first row sensing pattern SP11 and the third row sensing pattern SP13, and the second row connection pattern CP12 forms a single body with the second row sensing pattern SP12 and the fourth row sensing pattern SP14. However, this is presented as an example, and the first and second row connection patterns CP11 and CP12 may be disposed on different layers from the row sensing patterns SP11, SP12, SP13, and SP14, and the first and second row connection patterns CP11 and CP12 may be formed separately from and directly contact the row sensing patterns SP11, SP12, SP13, and SP14, and are not limited to any one embodiment.

According to the present invention, even when the row sensing patterns SP11, SP12, SP13, and SP14 are spaced apart from each other with the module hole MH therebetween, the row sensing patterns SP11, SP12, SP13, and SP14 may be electrically connected through the row connection patterns CP11 and CP12 and the first connection line BL1. In addition, as the first row sensing pattern SP11 and the second row sensing pattern SP12, even when a sensing pattern has a partially cut shape adjacent to the module hole MH, the sensing pattern is connected through the first connection line BL1, thereby allowing stable electrical connection between the row sensing patterns SP11, SP12, SP13, and SP14.

Referring to FIG. 6B, the first column sensing pattern SP21 and the second connection line BL2 are disposed on different layers. The first column contact portion CT21 passes through the first sensing insulating layer SI1 to connect the first column sensing pattern SP21 disposed on the first sensing insulating layer SI1 and the second connection line BL2 disposed below the first sensing insulating layer SI1.

In the present embodiment, the first column sensing pattern SP21 may include a main portion P1 non-overlapping the hole area HA and a protrusion P2 overlapping the hole area HA. The main portion P1 is spaced apart from the first connection line BL1 and the second connection line BL2 on a plane. The main portion P1 may substantially correspond to a shape in which the first row sensing pattern SP11 is rotated by 90 degrees clockwise.

The protrusion P2 is connected to the main portion P1. The protrusion P2 may protrude from the main portion P1 to the hole area HA. The protrusion P2 extends along the second connection line BL2. In the present embodiment, the protrusion P2 may form a single body with the main portion P1. The protrusion P2 may overlap each of the first connection line BL1 and the second connection line BL2 on a plane.

The protrusion P2 may pass through the first connection line BL1 to be connected to the second connection line BL2. The first column contact portion CT21 is defined on the protrusion P2. The first column contact portion CT21 passes through the first sensing insulating layer SI1 to connect the protrusion P2 and the second connection line BL2.

Meanwhile, in the present embodiment, the first connection line BL1 and the second connection line BL2 may be disposed on the same layer as the first column connection pattern CP21. The first connection line BL1 and the second connection line BL2 may include the same material as the first column connection pattern CP21. In this case, when forming the first column connection pattern CP21, the first connection line BL1 and the second connection line BL2 may be formed together using the same mask, and accordingly, the process may be simplified and may require less cost. However, this is presented as an example, and the first connection line BL1 and the second connection line BL2 may include different materials from the first column connection pattern CP21, and are not limited to any one embodiment.

Meanwhile, as shown in FIG. 6C, in the sensing unit 220A, the first column sensing pattern SP21A may include a main portion P11 and a protrusion P21 disposed on different layers. In the present embodiment, the main portion P11 is illustrated to be disposed between the first sensing insulating layer SI1 and the second sensing insulating layer SI2, and the protruding portion P21 is disposed on the second sensing insulating layer SI2. The protrusion P21 passes through the second sensing insulating layer SI2 to be connected to the main portion P11, and passes through the first sensing insulating layer SI1 and the second sensing insulating layer SI2 to be connected to the second connection line BL2. In this case, the first column contact portion CT21A may be defined to pass through the first sensing insulating layer SI1 and the second sensing insulating layer SI2.

The present invention includes the connection line BL1 and the second connection line BL2, and the first sensing electrode SE1 and the second sensing electrode SE1 having sensing patterns spaced apart from each other with the module hole MH each may thus stably keep electrical connection. In addition, the connection line BL1 and the second connection line BL2 are configured to non-overlap each other and to be disposed on different layers from the sensing patterns, and a short circuit between the first connection line BL1 and the second connection line BL2 may thus be stably prevented. According to the present invention, even when the module hole MH is formed in the electronic panel 200, a decrease in sensitivity due to the module hole MH may be easily prevented.

Meanwhile, as shown in FIG. 5B, a sensing unit 220-1 may include sensing electrodes SE1-1 and SE2-1 having various shapes. The sensing electrodes SE1-1 and SE2-1 each may include an edge having a plurality of curves. To be specific, in the first row sensing pattern SP11-1, a side S11_H facing the module hole MH may include a curve, and an opposite side S11_E may include a plurality of curves. Accordingly, sensitivity between the first sensing electrode SE1-1 and the second sensing electrode SE2-1 may be enhanced, and visibility may be improved.

Alternatively, as shown in FIG. 5C, a sensing unit 220-3 may include sensing electrodes SE1-2 and SE2-2 having a mesh shape. The sensing patterns SP11-2, SP12-2, SP13-2, SP14-2, SP21-2, SP22-2, SP23-2, and SP24-2 each may be formed of a plurality of mesh lines crossing each other. The mesh lines may include conductive materials. For example, the mesh lines may be formed of a metal, a conductive metal oxide, a conductive polymer, or a combination thereof. Accordingly, the sensing unit 220-2 may have improved flexibility, and may thus have improved reliability against folding stress.

According to the embodiment of the present invention, sensing patterns having various shapes may be included as long as the sensing patterns are connected through the first connection line BL1 and the second connection line BL2, and the embodiment of the present invention is not limited to any one.

FIGS. 7A to 7D are plan views illustrating a portion of a sensing unit according to an embodiment of the present invention. In FIGS. 7A to 7D, an area corresponding to FIG. 5A is illustrated for the convenience of description. Hereinafter, embodiments of the present invention will be described with reference to FIGS. 7A to 7D. Meanwhile, the same reference numerals are applied to the same configurations as those described in FIGS. 1A to 6C, and redundant descriptions thereof will be omitted.

Column sensing patterns SP21, SP22, SP23, and SP24, column connection patterns CP21 and CP22, row connection patterns CP11 and CP12, and a third row sensing pattern SP13, a fourth row sensing pattern SP14, and a second connection line BL2 shown in FIGS. 7A to 7D may substantially correspond to the components illustrated in FIG. 5A. Hereinafter, redundant descriptions will be omitted.

Figure 7A:
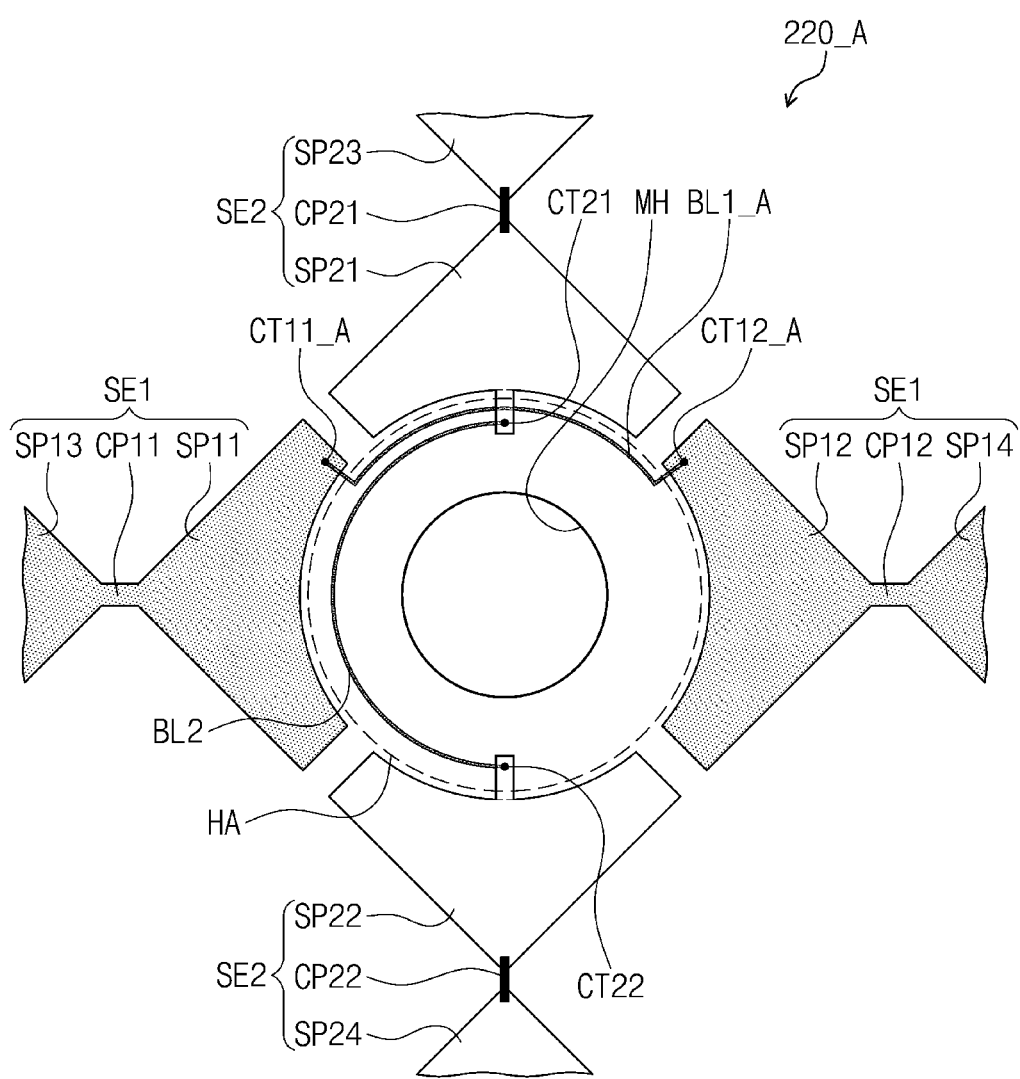

As shown in FIG. 7A, a first connection line BL1_A connects a first row sensing pattern SP11_A and a second row sensing pattern SP12_A. In this case, a first row contact portion CT11_A may be defined in an area close to an edge from the center of the first row sensing pattern SP11_A so as to be adjacent to a column sensing pattern adjacent to the first row contact portion CT11_A, for example, the first column sensing pattern SP21. In addition, a second row contact portion CT12_A may be defined in an area close to an upper side from the center of the second row sensing pattern SP12_A so as to be adjacent to a column sensing pattern adjacent to the second row contact portion CT12_A, for example, the first column sensing pattern SP21.

Accordingly, the length of the first connection line BL1_A may substantially become shorter than the length of the first connection line BL1 illustrated in FIG. 5A. However, this is presented as an example, and the length of the first connection line BL1_A may be variously configured according to positions of the first row contact unit CT11_A and the second row contact unit CT12_A, and is not limited to any one embodiment.

Figure 7B:
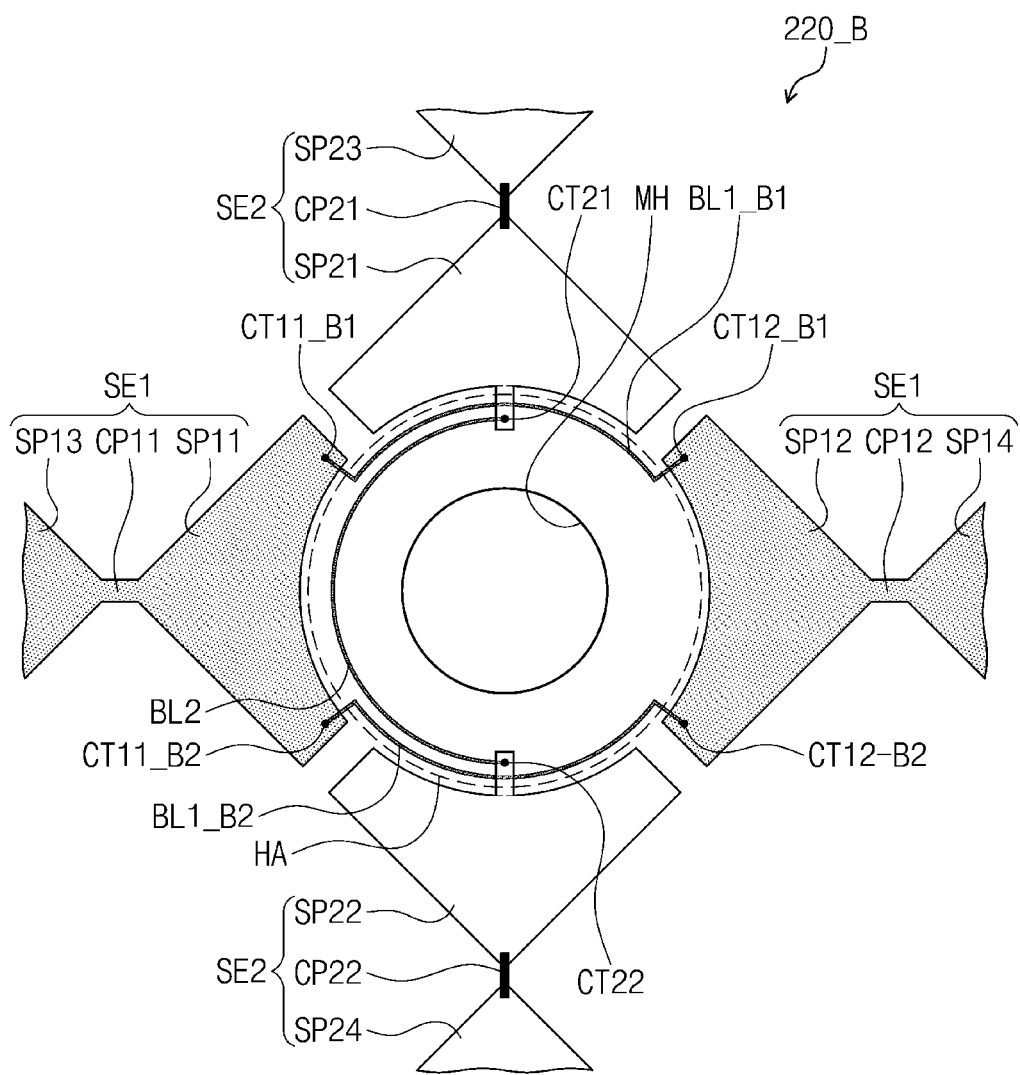

Alternatively, as shown in FIG. 7B, a sensing unit 220_B may include a plurality of first connection lines BL1_B1 and BL1_B2. The first connection lines BL1_B1 and BL1_B2 connect the first row sensing pattern SP11 and the second row sensing pattern SP12, respectively. To be specific, the upper connection line BL1_B1 of the first connection lines BL1_B1 and BL1_B2 is disposed to be relatively closer to the first column sensing pattern SP21 to connect the first row sensing pattern SP11 and the second row sensing pattern SP12. The lower connection line BL1_B2 of the first connection lines BL1_B1 and BL1_B2 is disposed to be relatively closer to the second column sensing pattern SP22 to connect the first row sensing pattern SP11 and the second row sensing pattern SP12.

According to the present invention, the sensing unit 220_B includes the plurality of first connection lines BL1_B1 and BL1_B2, and the first row sensing pattern SP11 and the second row sensing pattern SP12 may thus be connected through four contact portions CT11_B1, CT11_B2, CT21_B1, and CT22_B2. Accordingly, electrical resistance between the first row sensing pattern SP11 and the second row sensing pattern SP12 is reduced, making electrical connection easy. In addition, the plurality of first connection lines BL1_B1 and BL1_B2 are included to stably keep electrical connection even when any one of the first connection lines is damaged, and the reliability of the sensing unit 220_B may thus be improved.

Figure 7C:
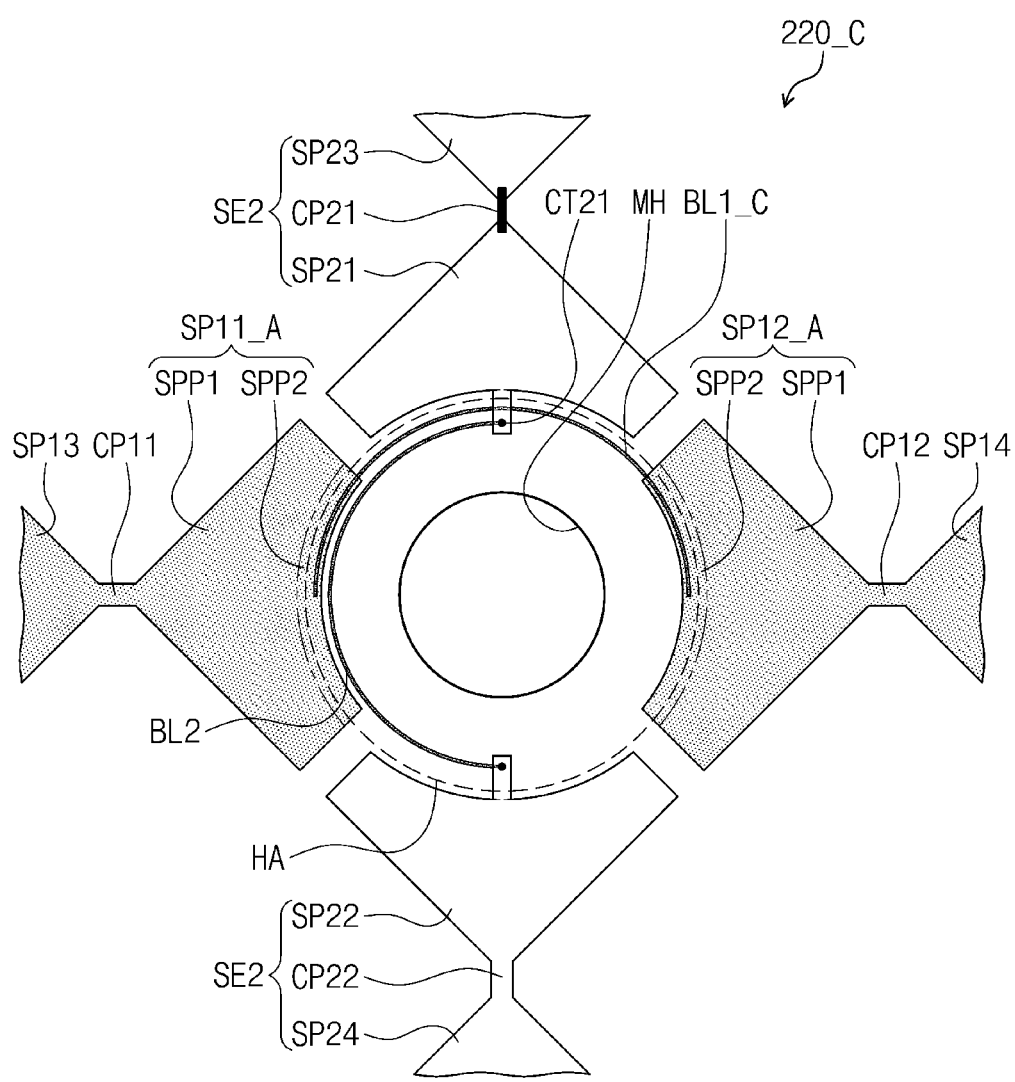

Alternatively, as shown in FIG. 7C, in a sensing unit 220_C, a first connection line BL1_C may be formed only in a semicircular curve. In the present embodiment, the first connection line BL1_C is illustrated in a semicircular shape curved upwards.

In this case, the first row sensing pattern SP11_A and the second row sensing pattern SP12_A each may include a main portion SPP1 and a protrusion SPP2. The main portion SPP1 may be a portion non-overlapping the hole area HA. The main portion SPP1 is spaced apart from the first connection line BL1_C on a plane. In an embodiment of the present invention, the main portion SPP1 may correspond to a shape in which the first column sensing pattern SP21 is rotated by 90 degrees counter-clockwise.

The protrusion SPP2 may be connected to the main portion SPP1 to have a single body shape. The protrusion SPP2 may be a portion overlapping the hole area HA. The protrusion SPP2 is spaced apart from the second connection line BL2 and overlaps the first connection line BL1_C on a plane.

In the present embodiment, the electrical connection between the first connection line BL1_C and the first row sensing pattern SP11_A may be achieved in an area overlapping the first row sensing pattern SP11_A of the first connection line BL1_C. In addition, the electrical connection between the first connection line BL1_C and the second row sensing pattern SP12_A may be achieved in an area overlapping the second row sensing pattern SP12_A of the first connection line BL1_C. Accordingly, a contact portion between the first row sensing pattern SP11_A and the first connection line BL1_C and between the second row sensing pattern SP12_A and the first connection line BL1_C may be provided in the form of a curve on a plane.

According to the present invention, the protrusion SPP2 may be further included to increase areas of the first row sensing pattern SP11_A and the second row sensing pattern SP12_A. Accordingly, a decrease in sensitivity in an area adjacent to the hole area HA may be prevented. In addition, according to the present invention, the first connection line BL1_C may be simplified in configuration since the shape of the first connection line BL1_C may be formed only in a curved shape similar to the shape of the module hole MH. Further, a contact area between the row sensing patterns and the first connection line BL1_C may be increased, thereby improving electrical properties.

Figure 7D:
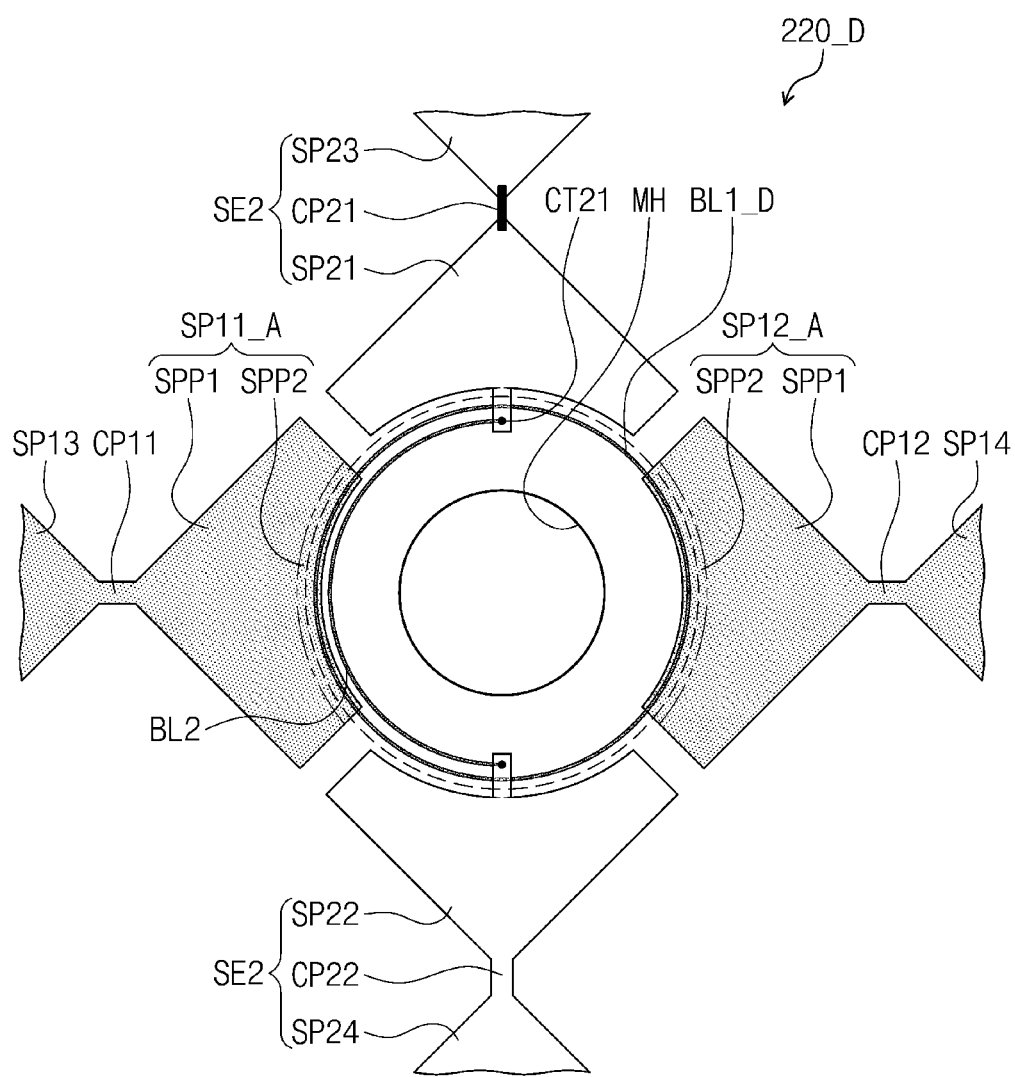

Alternatively, referring to FIG. 7D, in a sensing unit 220_D according to an embodiment of the present invention, a first connection line BL1_D may have a closed line shape. In the present embodiment, the first connection line BL1_D is illustrated in a circular shape surrounding the module hole MH. The first connection line BL1_D is spaced apart from the second connection line BL2 on a plane. Meanwhile, the first connection line BL1_D may have a polygonal shape or an oval shape as long as the first connection line BL1_D corresponds to a closed line shape and is spaced apart from the second connection line BL2, and is not limited to any one embodiment.

The first connection line BL1_D may overlap and contact protrusions SPP2 of each of the first and second row sensing patterns SP11_A and SP12_A on a plane. According to the present invention, the sensing unit 220_D may be simplified in configuration by including the first connection line BL1_D having a closed line shape. In addition, a connection area between the first connection line BL1_D and the row sensing patterns may be increased, thereby improving the sensitivity in an area adjacent to the module hole MH and the electrical reliability of the sensing unit 220_D.

According to the sensing units 220_A, 220_B, 220_C, and 220_D according to the present invention, shapes of the first connection lines BL1_A, BL1_B1, BL1_B2, BL1_C, BL1_D are variously configured, making the electrical connection between the row sensing patterns in an area adjacent to the module hole MH easy so as to improve electrical reliability. The sensing units 220_A, 220_B, 220_C, and 220_D according to the present invention may be provided in various forms, and are not limited to any one embodiment.

FIGS. 8A to 8D are plan views illustrating a portion of a sensing unit according to an embodiment of the present invention. In FIGS. 8A to 8D, an area corresponding to FIG. 5A is illustrated for the convenience of description. Hereinafter, embodiments of the present invention will be described with reference to FIGS. 8A to 8D. Meanwhile, the same reference numerals are applied to the same configurations as those described in FIGS. 1A to 7D, and redundant descriptions will be omitted.

Row sensing patterns SP11, SP12, SP13, and SP14, row connection patterns CP11 and CP12, column connection patterns CP21 and CP22, and a third column sensing pattern SP23, a fourth column sensing pattern SP24, and a first connection line BL1 shown in FIGS. 8A to 8D may substantially correspond to the components illustrated in FIG. 5A. Hereinafter, redundant descriptions will be omitted.

Figure 8A:
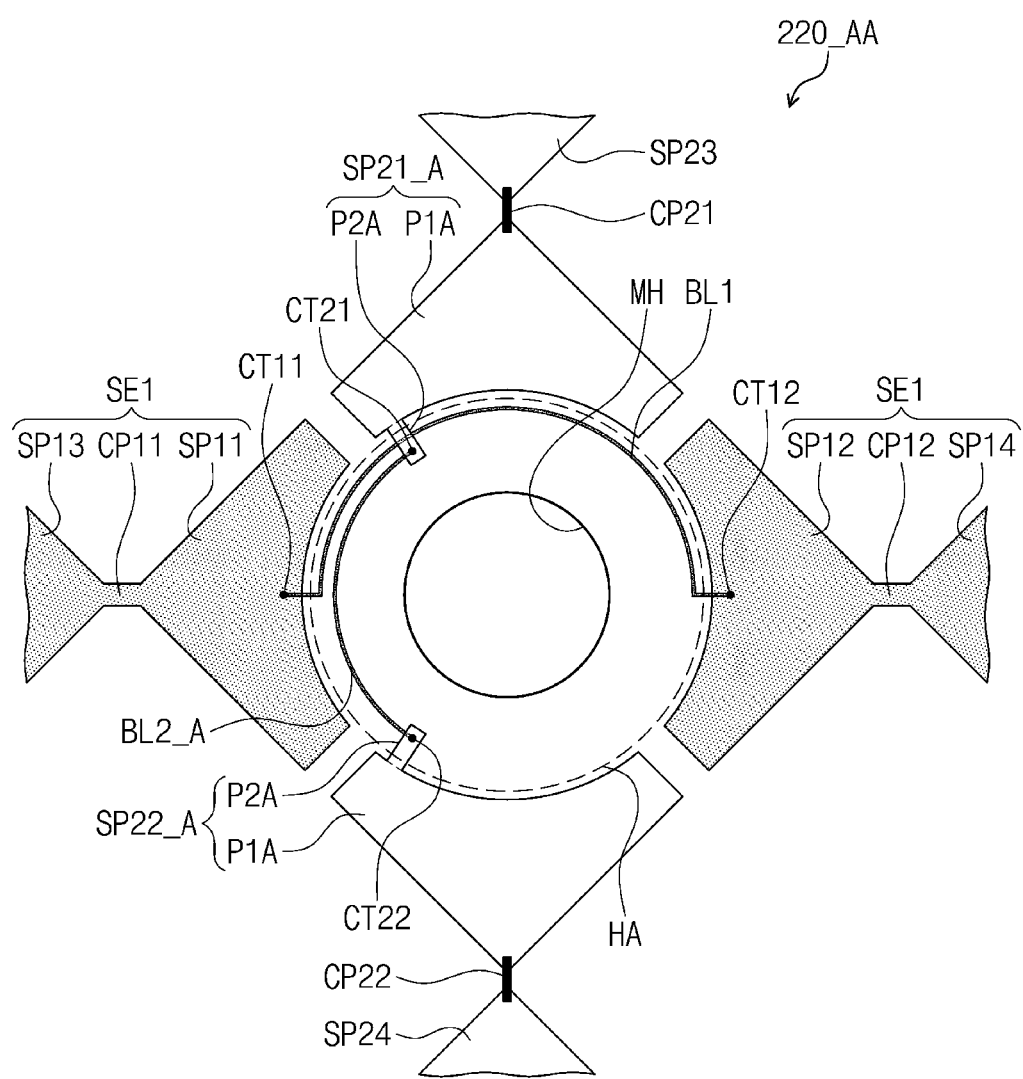

As shown in FIG. 8A, in a sensing unit 220_AA, a second connection line BL2_A connects a first column sensing pattern SP21_A and a second column sensing pattern SP22_A. In this case, a first column contact portion CT21_A may be defined in an area close to the left side from the center of the first column sensing pattern SP21_A so as to be adjacent to a row sensing pattern adjacent to the first column contact portion CT21_A, for example, the first row sensing pattern SP11. In addition, a second column contact portion CT22_A may be defined in an area close to the left side from the center of the second column sensing pattern SP22_A so as to be adjacent to a row sensing pattern adjacent to the second column contact portion CT22_A, for example, the first row sensing pattern SP11.

Accordingly, the length of the second connection line BL2_A may be substantially become shorter than the length of the second connection line BL2 shown in FIG. 5A. However, this is presented as an example, and the length of the second connection line BL2_A may be variously configured according to positions of the first and second column contact portions CT21_A and CT22_A, and is not limited to any one embodiment.

Figure 8B:
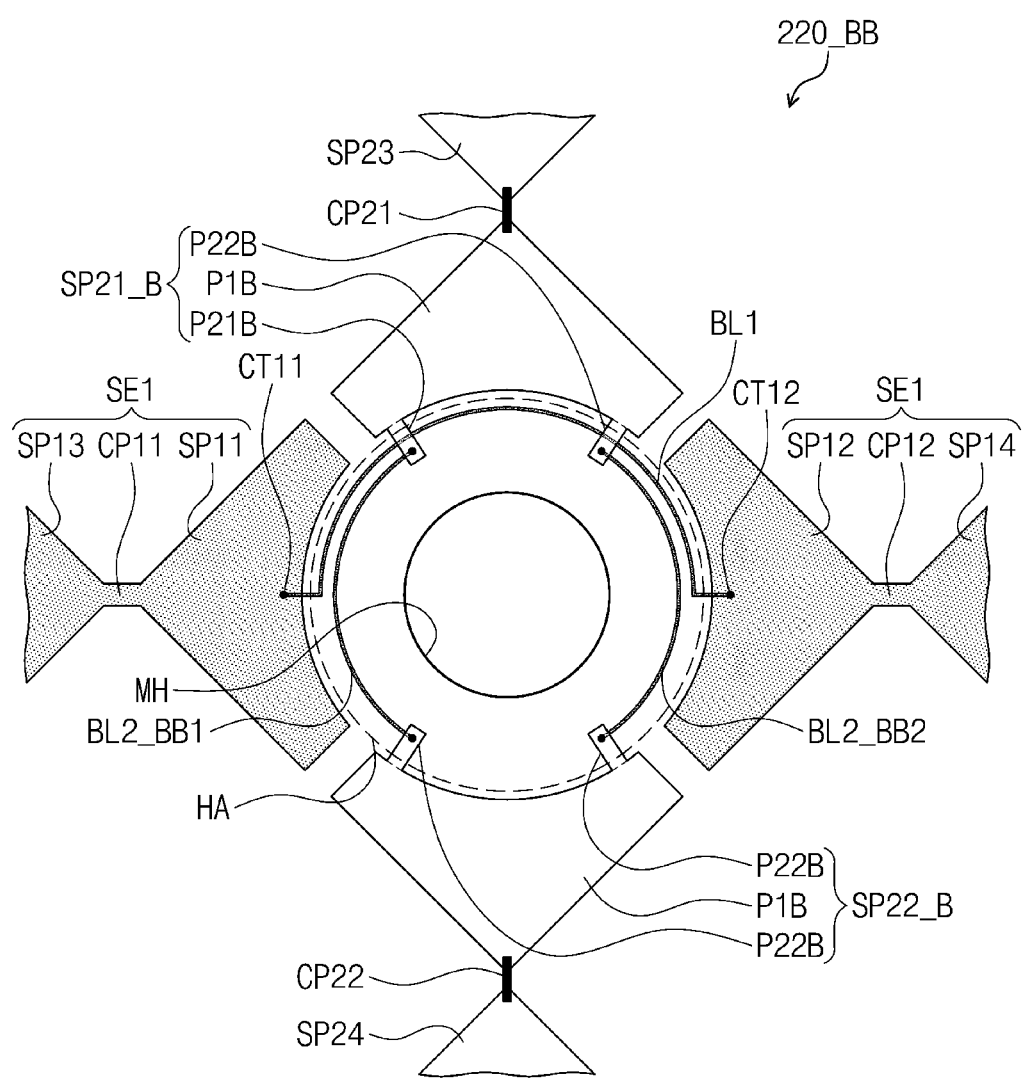

Alternatively, as shown in FIG. 8B, a sensing unit 220_BB may include a plurality of second connection lines BL2_B1 and BL1_B2. The second connection lines BL2_B1 and BL1_B2 connect a first column sensing pattern SP21_B and a second column sensing pattern SP22_B, respectively. In the present embodiment, the first column sensing pattern SP12_B and the second column sensing pattern SP22_B each may include a main portion P1B, a first protrusion P21B, and a second protrusion P22B. The main portion P1B may be a portion spaced apart from the hole area HA. The main portion P1B non-overlaps the hole area HA on a plane, and non-overlaps the first connection line BL1 and the second connection lines BL2_B1 and BL2_B2 as well.

The first protrusion P21B and the second protrusion P22B are connected to the main portion P1B and respectively protrude from the main portion P1B towards the hole area HA. The first protrusion P21B and the second protrusion P22B may extend along a direction crossing the second connection lines BL2_B1 and BL2_B2. The first protrusion P21B and the second protrusion P22B may extend up to the hole area HA to overlap the second connection lines BL2_B1 and BL2_B2 on a plane. In this case, the first protrusion P21B and the second protrusion P22B may also partially overlap the first connection line BL1.

The left connection line BL2_B1 of the second connection lines BL2_B1 and BL2_B2 is disposed to be relatively closer to the first row sensing pattern SP11 to connect the first column sensing pattern SP21_B and the second column sensing pattern SP22_B. The right connection line BL2_B2 of the second connection lines BL2_B1 and BL2_B2 is disposed to be relatively closer to the second row sensing pattern SP12 to connect the first column sensing pattern SP21_B and the second column sensing pattern SP22_B. The second connection lines BL2_B1 and BL2_B2 may be substantially connected to the column sensing patterns through the first protrusion P21B and the second protrusion P22B.

According to the present invention, a sensing unit 220_BB includes a plurality of second connection lines BL2_B1 and BL2_B2, making the electrical connection between the column sensing patterns SP21_B and SP22_B easy. In addition, even when any one of the second connection lines is damaged, the electrical connection between the column sensing patterns SP21_B and SP22_B may be stably kept, and the reliability of the sensing unit 220_BB may thus be improved.

Figure 8C:
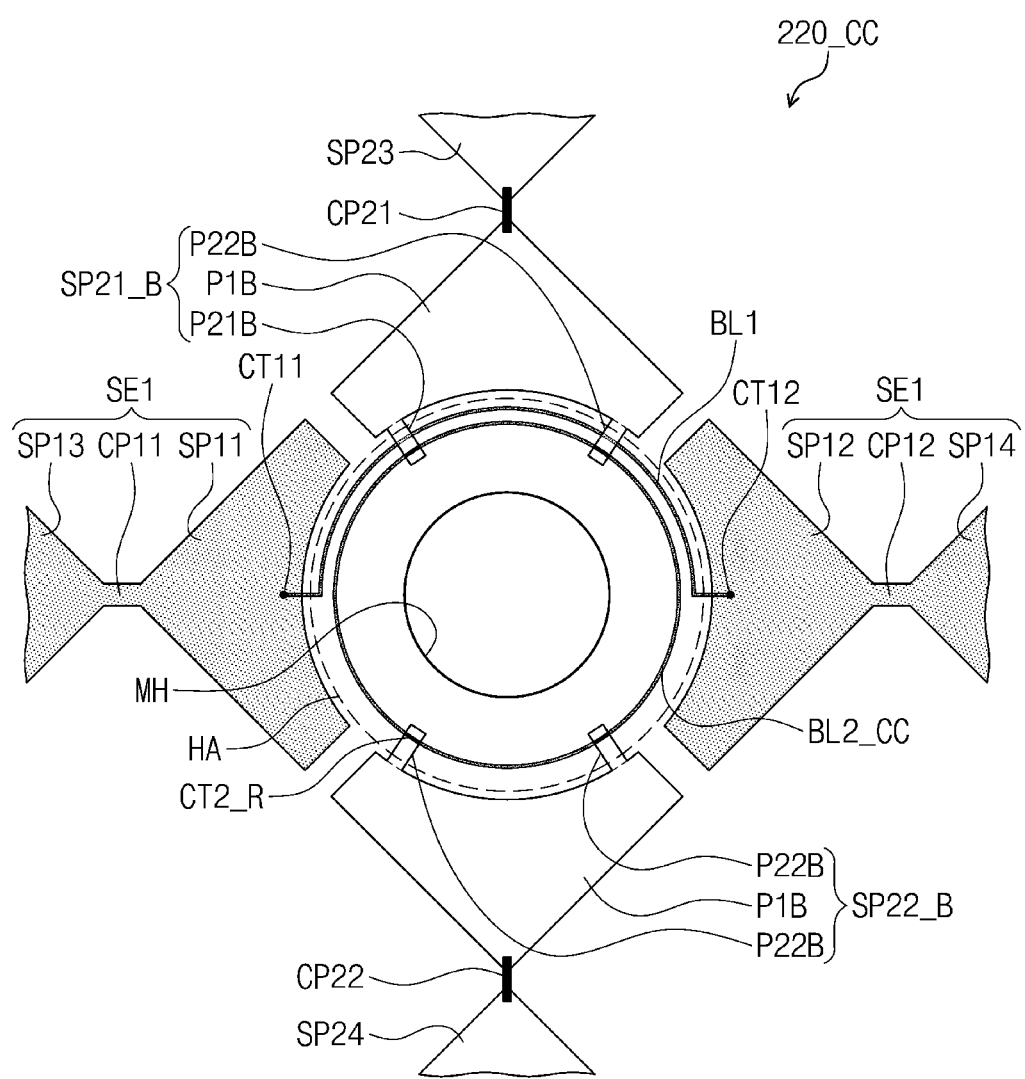

Alternatively, as shown in FIG. 8C, in a sensing unit 220_CC, a second connection line BL2_C may have a closed line shape. In the present embodiment, the second connection line BL2_C is illustrated in a circular shape surrounding the module hole MH. The second connection line BL2_C is spaced apart from the first connection line BL1 on a plane. The second connection line BL2_C may be disposed relatively closer to the module hole MH than the first connection line BL1. Meanwhile, the second connection line BL2_C may have a polygonal shape or an oval shape as long as the second connection line BL2_C corresponds to a closed line shape and is disposed to be spaced apart from the first connection line BL1, and is not limited to any one embodiment.

In the present embodiment, the first column sensing pattern SP21_B and the second column sensing pattern SP22_B may correspond to the first column sensing pattern SP21_B and the second column sensing pattern SP22_B shown in FIG. 8B. The second connection line BL2_C may overlap and contact protrusions P21B and P22B of each of the first and second column sensing patterns SP21_B and SP22_B on a plane. A contact portion CT2_R between the column sensing patterns SP21_B and SP22_B and the second connection line BL2_C may be defined in an area overlapping the protrusions P21B and P22B.

According to the present invention, one second connection line BL2_C may be connected to each of the plurality of protrusions P21B and P22B. Accordingly, even when a portion of the second connection line BL2_C is damaged, the electrical connection between the column sensing patterns SP21_B and SP22_B may be kept. Accordingly, the electrical reliability of the sensing unit 220_CC is improved as well as the sensing unit 220_C may be simplified in configuration.

Figure 8D:
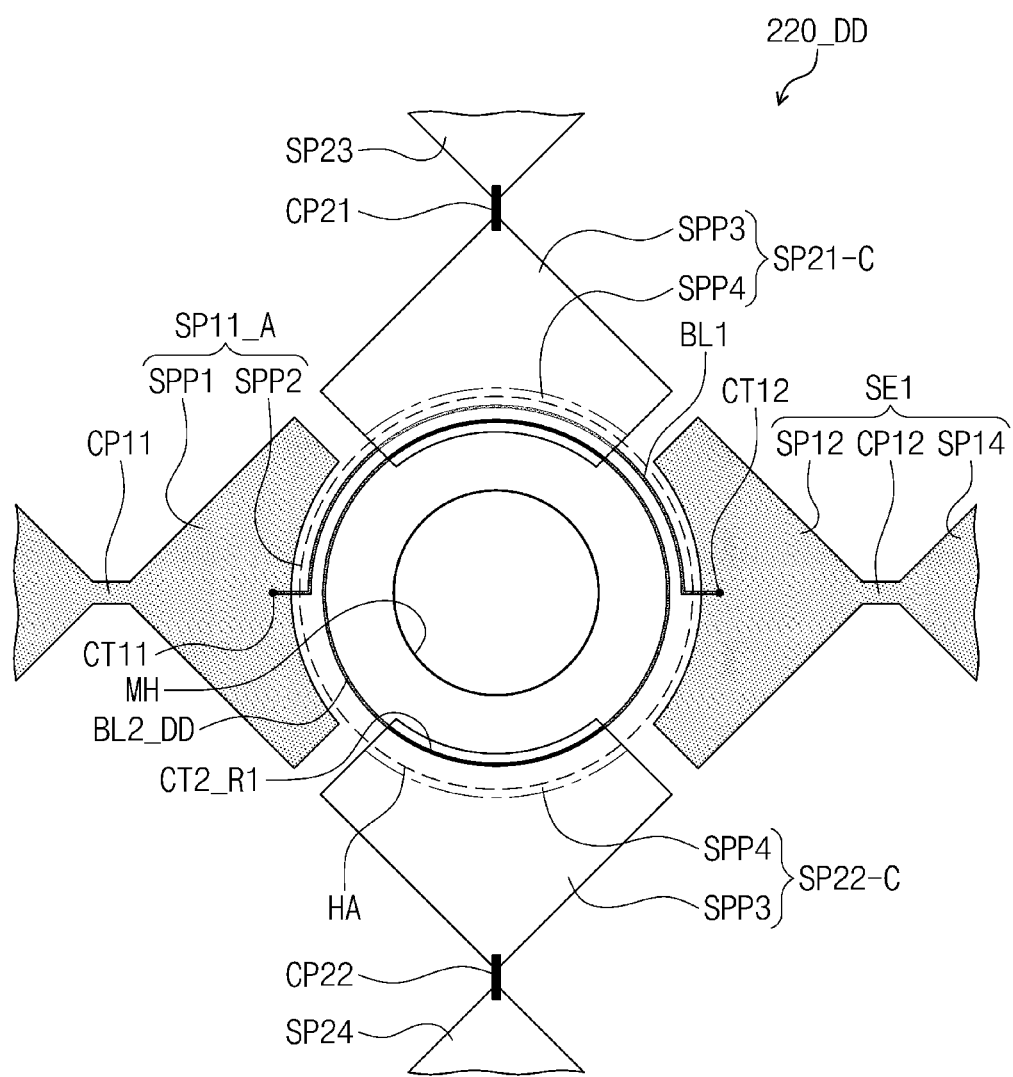

Alternatively, as shown in FIG. 8D, in a sensing unit 220_DD, a second connection line BL2_D may have a closed line shape. In the present embodiment, the second connection line BL2_D is illustrated in a shape corresponding to the second connection line BL2_C shown in FIG. 8C.

The second connection line BL2_D may overlap each of a first column sensing pattern SP21-C and a second column sensing pattern SP22-C. The first column sensing pattern SP21-C and the second column sensing pattern SP22-C each may include a main portion SPP3 and a protrusion SPP4.

The main portion SPP3 may be a portion non-overlapping the hole area HA. The main portion SPP3 may be spaced apart from the first connection line BL1 and the second connection line BL2_D on a plane. The main portion SPP3 may correspond to a shape in which the first row sensing pattern SP11 is rotated by 90 degrees clockwise.

The protrusion SPP4 may be a portion overlapping the hole area HA. The protrusion SPP4 may be connected to the main portion SPP3 to be formed as a single body. The protrusion SPP4 extends in the hole area HA to overlap the second connection line BL2_D. In this case, the protrusion SPP4 may partially overlap the first connection line BL1.

A contact portion CT2_R1 between the column sensing patterns and the second connection line BL2_D may be defined to overlap the protrusion SPP4. In the present embodiment, the contact portion CT2_R1 is illustrated in the form of a curve.

According to the present invention, the protrusion SPP4 may be further included to increase areas of the first column sensing pattern SP21-C and the second column sensing pattern SP22-C. Accordingly, a decrease in sensitivity in an area adjacent to the hole area HA may be prevented. In addition, according to the present invention, the second connection line BL2_D may be simplified in configuration since the shape of the second connection line BL2_D may be formed in a curved shape similar to the shape of the module hole MH. Further, a contact area between the column sensing patterns and the second connection line BL2_D may be increased, thereby improving electrical properties.

According to the sensing units 220_AA, 220_BB, 220_CC, and 220_DD according to the present invention, the shapes of the second connection lines BL2_A, BL2_B1, BL2_B2, BL2_C, and BL2_D are variously configured, making the electrical connection between the row sensing patterns in an area adjacent to the module hole MH easy so as to improve electrical reliability. The sensing units 220_AA, 220_BB, 220_CC, and 220_DD according to the present invention may be provided in various forms, and are not limited to any one embodiment.

Figure 9A:
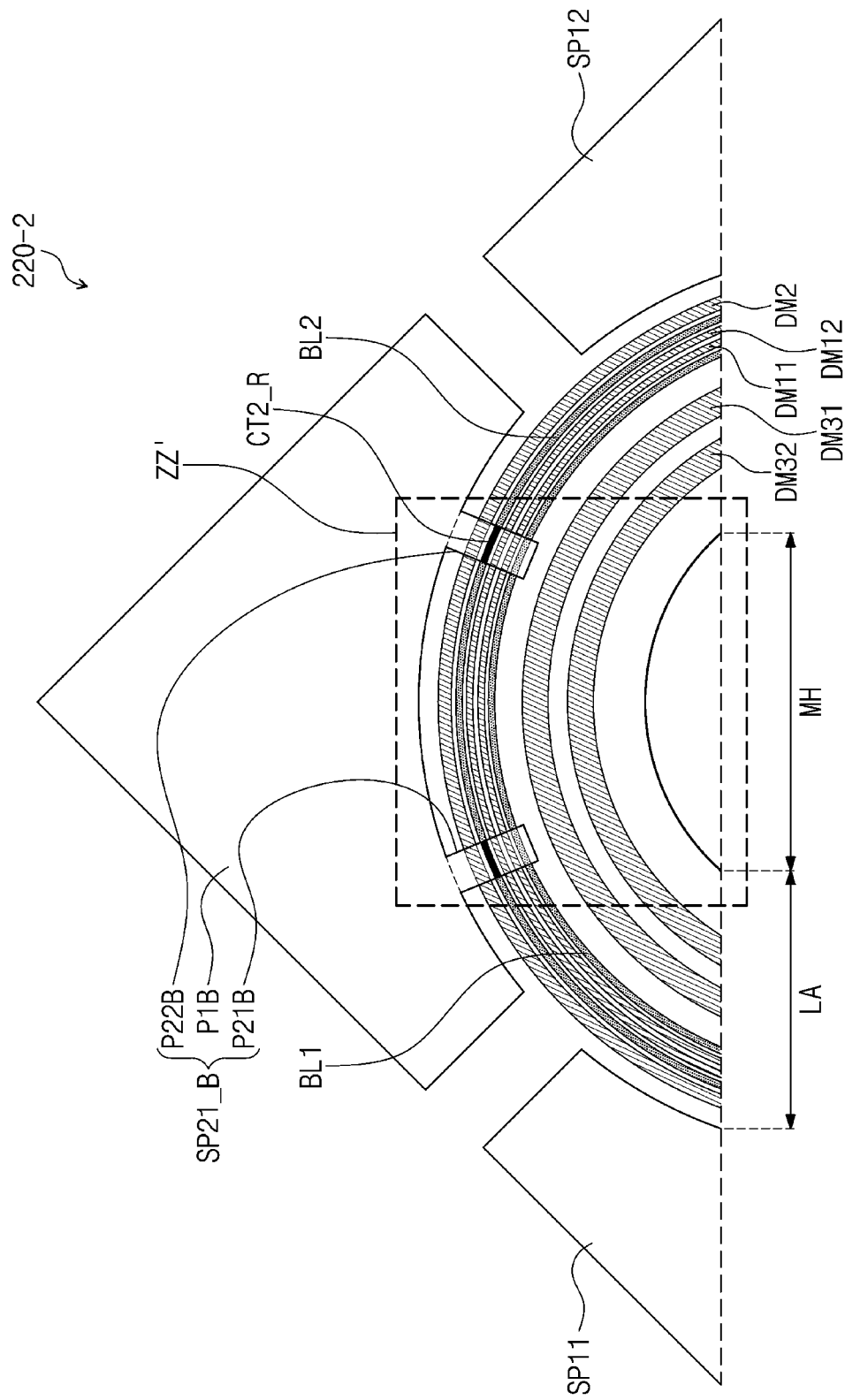
Figure 9B:
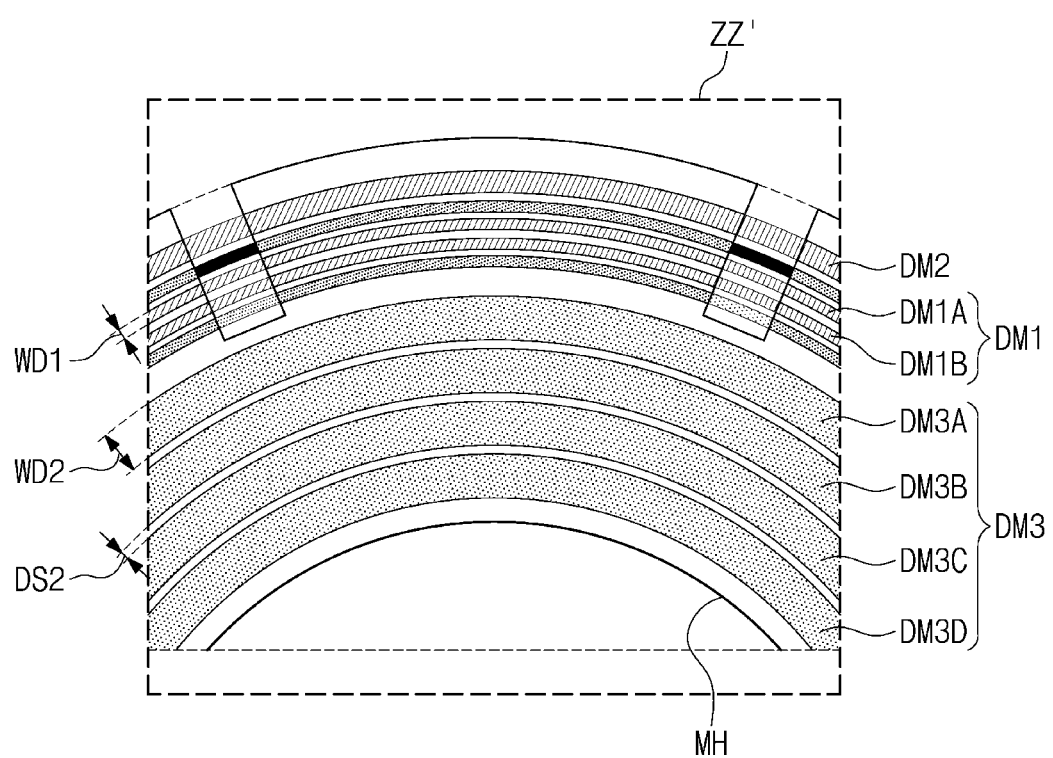

FIG. 9A is a plan view illustrating a portion of a sensing unit according to an embodiment of the present invention. FIG. 9B is a plan view enlarging area ZZ' shown in FIG. 9A. FIG. 9C is a plan view illustrating a portion of a sensing unit according to an embodiment of the present invention. FIGS. 9A and 9C, for the convenience of description, illustrate areas in which a first column sensing pattern SP21_B disposed adjacent to the module hole MH, a portion of the first row sensing pattern SP11, and a portion of the second row sensing pattern SP12 are disposed, and some components are omitted. Meanwhile, in the present embodiment, the first column sensing pattern SP21_B, the first row sensing pattern SP11, the second row sensing pattern SP12, the first connection line BL1, and the second connection line BL2_C may correspond to the first column sensing pattern SP21_B, a portion of the first row sensing pattern SP11, the second row sensing pattern SP12, the first connection line BL1, and the second connection line BL2_C shown in FIG. 8C. Hereinafter, redundant descriptions will be omitted.

As shown in FIG. 9A, the sensing unit 220-2 may further include a plurality of dummy patterns DM11, DM12, DM2, DM31, and DM32. The dummy patterns DM11, DM12, DM2, DM31, and DM32 may be disposed in a wiring area LA to surround the module hole MH. The dummy patterns DM11, DM12, DM2, DM31, and DM32 may include first dummy patterns DM11 and DM12, a second dummy pattern DM2, and third dummy patterns DM31 and DM32.

The first dummy patterns DM11 and DM12 are disposed between the first connection line BL1 and the second connection line BL_C. The first dummy patterns DM11 and DM12 may include conductive materials. For example, the first dummy patterns DM11 and DM12 may include a metal, a conductive oxide, a conductive polymer, or a combination thereof. The first dummy patterns DM11 and DM12 may electrically enable shielding between the first connection line BL1 and the second connection line BL2_C. Accordingly, a parasitic capacitance between the first connection line BL1 and the second connection line BL2_C transmitting different voltages may prevented to easily prevent noise in the sensing unit 220-2 from being caused.

The first dummy patterns DM11 and DM12 may be between the first connection line BL1 and the second connection line BL_C. The first dummy patterns DM11 and DM12 may be provided in plurality to be spaced apart from each other. In addition, a thickness WD1 of each of the first dummy patterns DM11 and DM12 may vary according to a voltage difference between the first connection line BL1 and the second connection line BL2. The first dummy patterns DM11 and DM12 according to an embodiment of the present invention may be provided in a singular or plural form according to intervals between the first connection line BL1 and the second connection line BL_C, and may be configured in various thicknesses WD1, and are not limited to any one embodiment.

The second dummy pattern DM2 may be disposed between the second connection line BL2_C and the first and second row sensing patterns SP11 and SP12. In this case, the second dummy pattern DM2 is illustrated in a closed line shape surrounding the module hole MH. Accordingly, some of the second dummy patterns DM2 may be disposed between the second connection line BL2_C and the first column sensing pattern SP21_B.

The second dummy pattern DM2 may include conductive materials. For example, the second dummy pattern DM2 may include a metal, a conductive oxide, a conductive polymer, or a combination thereof. The second dummy pattern DM2 electrically may enable shielding between the second connection line BL2_C and the first and second row sensing patterns SP11 and SP12. Accordingly, the electrical interference between the second connection line BL2_C, which transmits a different voltage from the first and second row sensing patterns SP11 and SP12, and the first and second row sensing patterns SP11 and SP12 may be easily prevented.

Meanwhile, in an embodiment of the present invention, when the first connection line BL1 is disposed closer to the first column sensing pattern SP21_B than the second connection line BL2_C, the second dummy pattern DM2 may be disposed between the first connection line BL1 and the first column sensing pattern SP21_B to electrically enable shielding between the first connection line BL1 and the first column sensing pattern SP21_B.

The third dummy patterns DM31 and DM32 may be disposed between the first connection line BL1 and the module hole MH. The third dummy patterns DM31 and DM32 may improve visibility in a hole area adjacent to the module hole MH. When an area of an empty space between the components disposed in the wiring area LA and the module hole MH is large, according to a difference in light reflectance, users may feel different in an area where the module hole MH is disposed.

The third dummy patterns DM31 and DM32 are disposed in an empty space of the hole area in which components are not disposed, and peripheral components, for example, the third dummy patterns DM31 and DM32 are formed in a shape having continuity with the first connection line BL1 and the second connection line BL2_B, and the module hole MH and the hole area may thus be prevented from being easily viewed by users.

The third dummy patterns DM31 and DM32 may include light blocking materials. For example, the third dummy patterns DM31 and DM32 may have a black or gray color. Alternatively, the third dummy patterns DM31 and DM32 may include a material having the same reflectance as the first and second connection lines BL1 and BL2, or include a material having the same reflectance as the other dummy patterns DM1 and DM2.

Third dummy patterns DM31 and DM32 may be provided in plurality to be spaced apart from each other. However, this is presented as an example, and the third dummy patterns DM31 and DM32 may be provided in a singular or plural form.

For example, as shown in FIG. 9B, the third dummy pattern DM3 may include four patterns DM3A, DM3B, DM3C, and DM3D. The number of the third dummy pattern DM3 may vary in configuration according to a distance DS2 between the patterns DM3A, DM3B, DM3C, and DM3D and a width WD2 of each of the patterns DM3A, DM3B, DM3C, and DM3D.

Meanwhile, as shown in FIG. 9C, in a sensing unit 220-3, the dummy patterns DM11, DM12, DM2, DM31, and DM32 are divided into a plurality of portions spaced apart from each other along an edge of the module hole MH. The dummy patterns DM11, DM12, DM2, DM31, and DM32 shown in FIG. 9C may be formed by taking the dummy patterns DM11, DM12, DM2, DM31, and DM32 shown in FIG. 9A along a predetermined cutting line CTL. According to the present invention, the dummy patterns DM11, DM12, DM2, DM31, and DM32 may be divided into a plurality of patterns taken along the edge of the module hole MH, and the visibility of the sensing unit 220-3 may thus be improved.

Figure 10A:
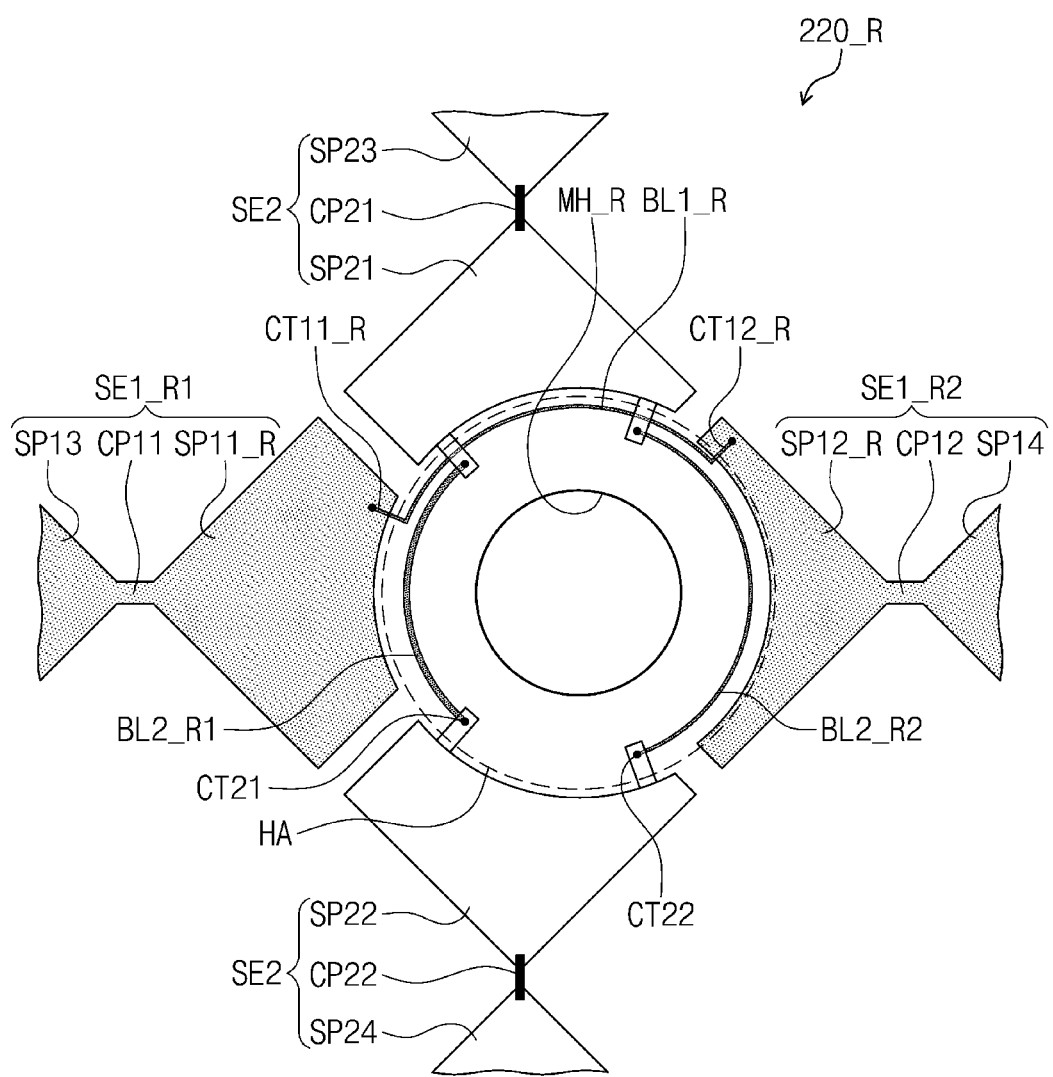
Figure 10B:
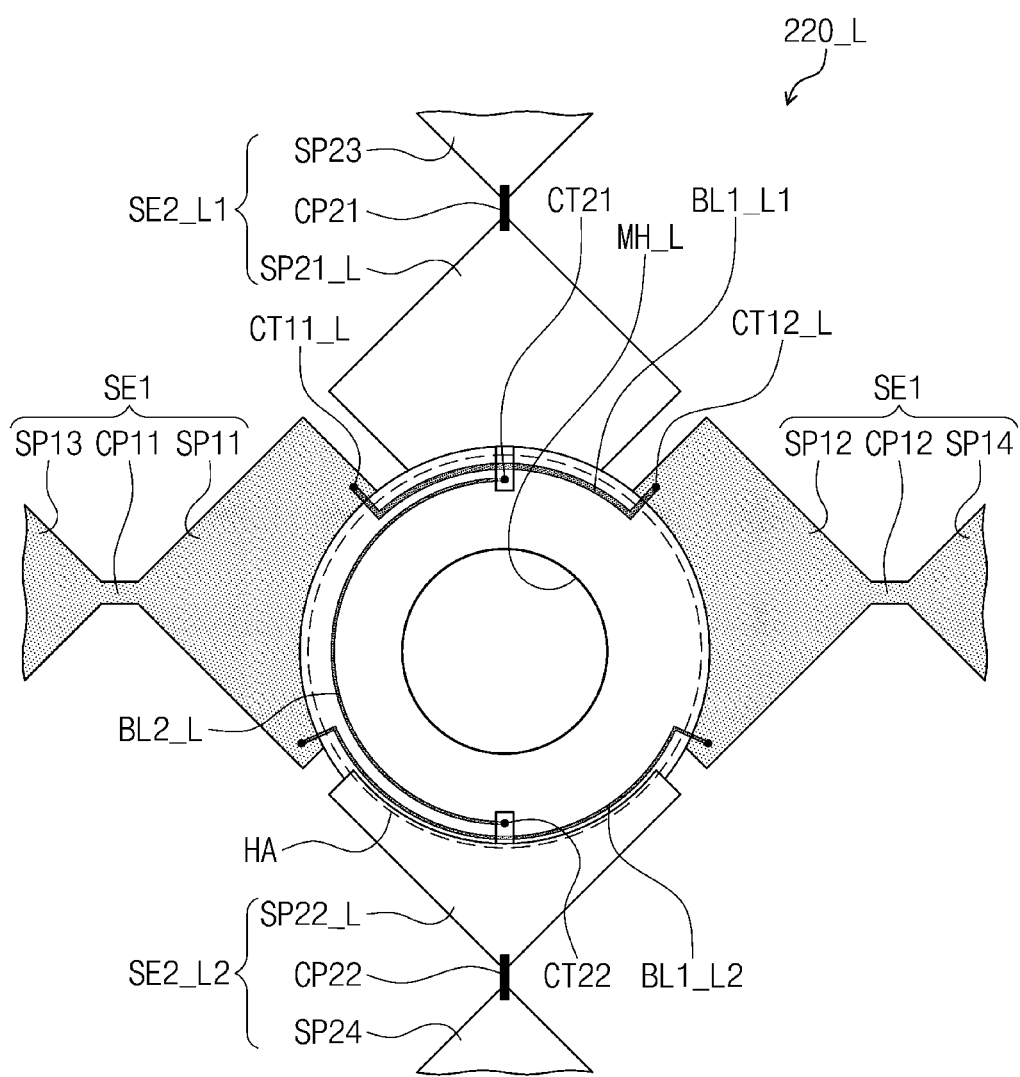

FIGS. 10A and 10B are plan views illustrating a portion of a sensing unit according to an embodiment of the present invention. FIGS. 10A and 10B briefly illustrate sensing units 220_R and 220_L in which module holes MH_R and MH_L formed at different positions are defined.

Referring to FIG. 10A, the sensing unit 220_R may correspond to an embodiment in which the position of the module hole MH (FIG. 8B) is relatively moved to the right side when compared to the sensing unit 220_BB shown in FIG. 8B. Accordingly, the first row sensing pattern SP11_R of the left first sensing electrode SE1_R1 arranged at the left and right sides of the module hole MH_R and the second row sensing pattern SP12_R of the right first sensing electrode SE1_R2 may have a shape that is asymmetric about the module hole MH_R. The first row sensing pattern SP11_R and the second row sensing pattern SP12_R are connected through a first connection line BL1_R.

According to the present invention, the module hole MH_R moves to the right side, and thus may be positioned closer to the right first sensing electrode SE1_R2 than the left first sensing electrode SE1_R1. In order to compensate for an area between the first row sensing pattern SP11_R and the second row sensing pattern SP12_R, at least a portion of the second row sensing pattern SP12_R having a greater reduction area may have a shape extending up to the inside of the hole area HA.

Accordingly, at least a portion of the second row sensing pattern SP12_R overlaps the hole area HA. In contrast, the first row sensing pattern SP11_R having a relatively smaller reduction area is disposed to be spaced apart from the hole area HA.

Meanwhile, in the present embodiment, the second connection lines BL2_R1 and BL2_R2 may have different thicknesses and lengths. For example, in the second connection lines BL2_R1 and BL2_R2, the left second connection line BL2_R1 has a relatively greater thickness than the right second connection line BL2_R2. In addition, the left second connection line BL2_R1 has a relatively shorter length than the right second connection line BL2_R2. According to the present invention, the resistance between the connection lines may be uniformly configured by reducing the thickness of the connection line having a relatively greater length.

Alternatively, referring to FIG. 10B, a sensing unit 220_L may correspond to an embodiment in which the position of the module hole MH (FIG. 7B) is relatively moved downwards on a plane compared to the sensing unit 220_B shown in FIG. 7B (see FIG. 7B). Accordingly, the first column sensing pattern SP21_L of the upper first sensing electrode SE2_L1 arranged at the left and right sides of the module hole MH_L and the second column sensing pattern SP22_L of the lower first sensing electrode SE2_L2 may have a shape that is asymmetric about the module hole MH_R. The first column sensing pattern SP21_L and the second column sensing pattern SP22_L are connected through a second connection line BL2_L.

According to the present invention, the module hole MH_L moves to the right side, and thus may be positioned closer to the lower first sensing electrode SE2_L2 than the upper first sensing electrode SE2_L1. In order to compensate for an area between the first column sensing pattern SP21_L and the second column sensing pattern SP22_L, at least a portion of the second column sensing pattern SP22_L having a greater reduction area may have a shape extending up to the inside of the hole area HA.

Accordingly, at least a portion of the second column sensing pattern SP22_L overlaps the hole area HA. In contrast, the first row sensing pattern SP11_R having a relatively smaller reduction area is disposed to be spaced apart from the hole area HA.

Meanwhile, in the present embodiment, the first connection lines BL1_L1 and BL1_L2 may have different thicknesses and lengths. For example, in the first connection lines BL1_L1 and BL1_L2, the upper first connection line BL1_L1 has a relatively greater thickness than the lower first connection line BL1_L2. In addition, the upper first connection line BL1_L1 has a relatively shorter length than the lower first connection line BL1_L2. According to the present invention, the resistance between the connection lines may be uniformly configured by reducing the thickness of the connection line having a relatively greater length.

According to the electronic units 220_R and 220_L of an embodiment of the present invention, the module holes MH_R and MH_L may be formed in various positions. Even sensitivity in the hall area HA may be provided by differently configuring widths of connection lines adjacent to the module holes MH_R and MH_L or areas of sensor patterns.

Figure 11A:
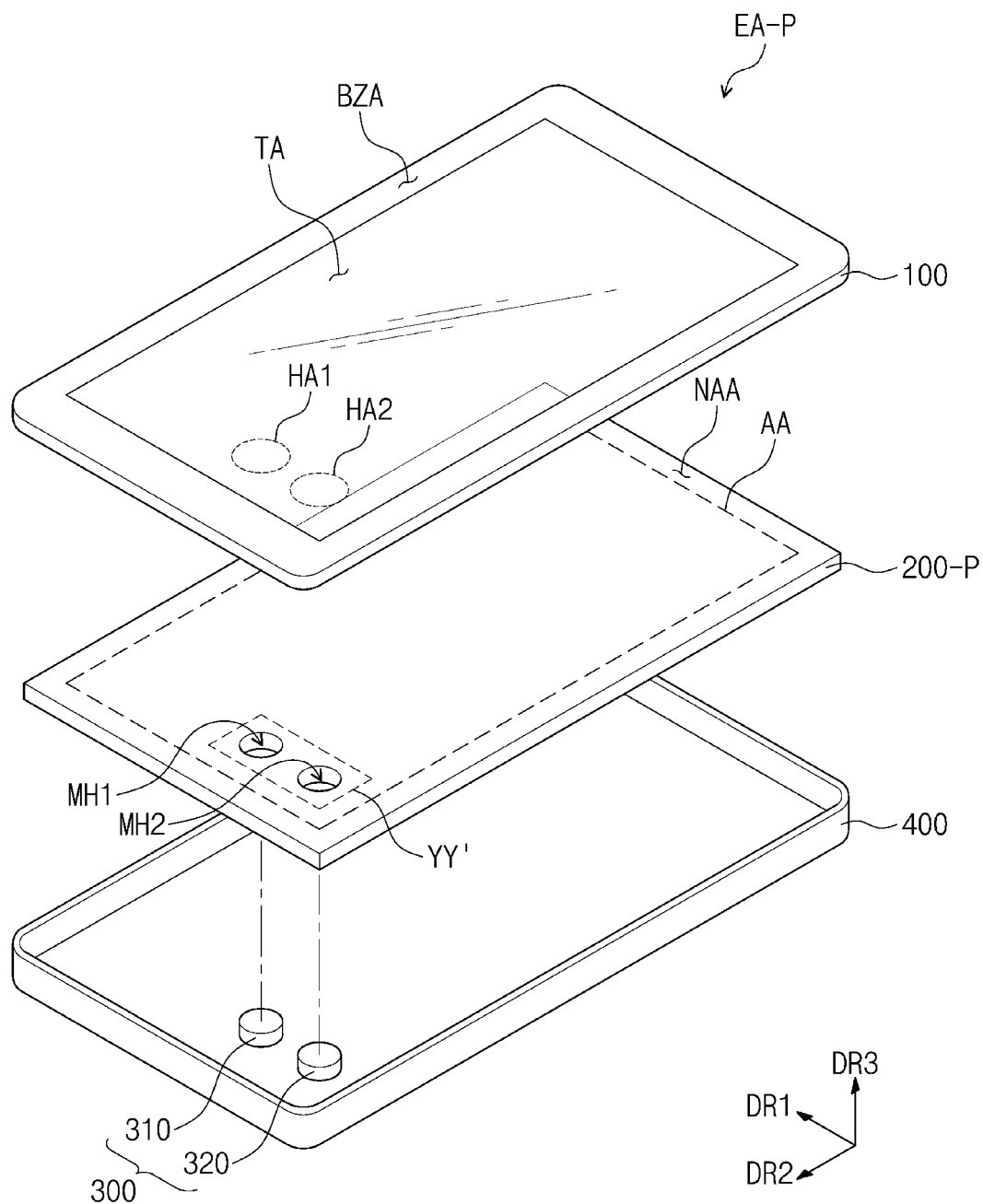
Figure 11B:
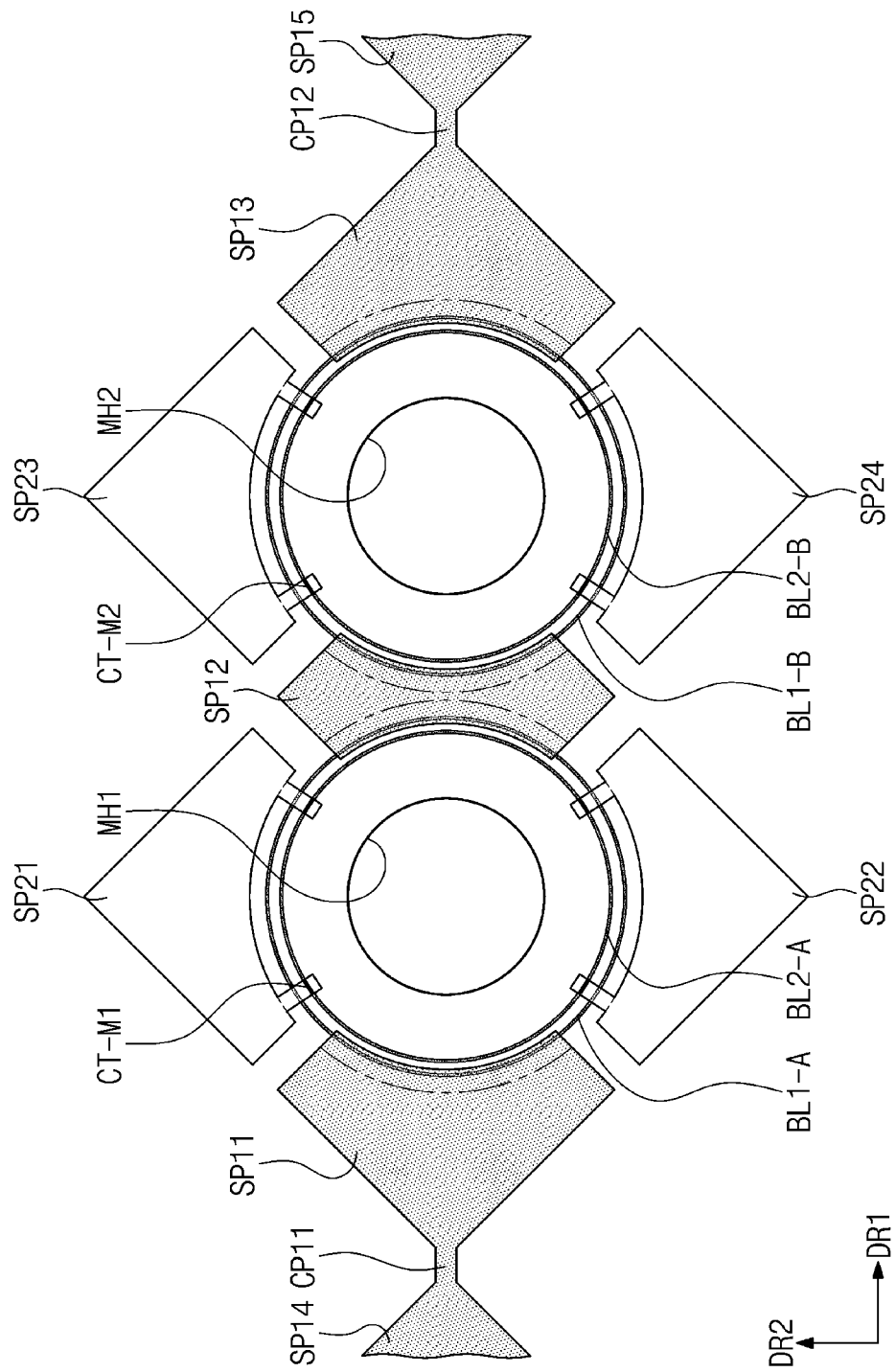

FIG. 11A is an exploded perspective view of an electronic apparatus according to an embodiment of the present invention. FIG. 11B is a plan view illustrating some components of FIG. 11A. In FIG. 11B, area YY' shown in FIG. 11A is illustrated for the convenience of description, and some components are omitted. Hereinafter, embodiments of the present invention will be described with reference to FIGS. 11A and 11B. Meanwhile, the same reference numerals are applied to the same configurations as those described in FIGS. 1A to 9C, and redundant descriptions will be omitted.

As shown in FIG. 11A, an electronic apparatus EA-P may include an electronic panel 200-P in which a plurality of module holes MH1 and MH2 are defined. The module holes MH1 and MH2 include a first module hole MH1 and a second module hole MH2. The first module hole MH1 and the second module hole MH2 are shown to be spaced apart from each other in the first direction DR1.

An electronic module 300 may include a first module 310 and a second module 320. The first module 310 overlaps the first module hole MH1, and the second module 320 overlaps the second module hole MH2. The first module 310 may be exposed through the first module hole MH1 even when disposed to overlap the active area AA, thereby receiving external signals through the first hole area HA1 or providing processed signals to the outside. In addition, the second module 320 may be exposed through the second module hole MH2 even when disposed to overlap the active area AA, receiving external signals through the second hole area HA2 or providing processed signals to the outside.

In FIG. 11B, some components of the sensing unit are shown. According to the present embodiment, first to fifth row sensing patterns SP11, SP12, SP13, SP14, and SP15 forming one row electrode, and first and second column sensing patterns SP21 and SP22 forming one column electrode, and third and fourth column sensing patterns SP23 and SP24 forming another column electrode are illustrated as examples.

The first row sensing pattern SP11 is disposed at the left side of the first module hole MH1, the second row sensing pattern SP12 is disposed between the first module hole MH1 and the second module hole MH2, and the third row sensing pattern SP13 is disposed at the right side of the second module hole MH2. The first row connection pattern CP11 is disposed at the left side of the first row sensing pattern SP11 to connect the fourth row sensing pattern SP14 and the first row sensing pattern SP11. The second row connection pattern CP12 is disposed at the right side of the third row sensing pattern SP13 to connect the third row sensing pattern SP13 and the fifth row sensing pattern SP15.

The first column sensing pattern SP21 and the second column sensing pattern SP22 are disposed to be spaced apart from each other in the second direction DR2 with the first module hole MH1 therebetween. The third column sensing pattern SP23 and the fourth column sensing pattern SP24 are disposed to be spaced apart from each other in the second direction DR2 with the second module hole MH2 therebetween.

In the present embodiment, a plurality of connection lines are disposed adjacent to each of the first module hole MH1 and the second module hole MH2. A first connection line BL1-A is disposed adjacent to the first module hole MH1 and is shown in a circular ring shape surrounding the first module hole MH1.

A second connection line BL2-A is disposed adjacent to the first module hole MH1 and is shown in a circular ring shape surrounding the first module hole MH1. The second connection line BL2-A has a size relatively adjacent to the first module hole MH1 than the first connection line BL1-A.

A third connection line BL1-B is disposed adjacent to the second module hole MH2 and is shown in a circular ring shape surrounding the second module hole MH2. A fourth connection line BL2-B is disposed adjacent to the second module hole MH2 and is shown in a circular ring shape surrounding the second module hole MH2. The fourth connection line BL2-B has a size relatively adjacent to the second module hole MH2 than the third connection line BL1-B.

In the present embodiment, the first row sensing pattern SP11 and the second row sensing pattern SP12 may overlap the first connection line BL1-A on a plane. The first connection line BL1-A may be electrically connected to the first row sensing pattern SP11 and the second row sensing pattern SP12 through an overlapping area. The first row sensing pattern SP11 and the second row sensing pattern SP12 have a size overlapping the first connection line BL1-A on a plane. Accordingly, the first row sensing pattern SP11 may have a relatively greater area than the first column sensing pattern SP21 or the second column sensing pattern SP22.

The second row sensing pattern SP12 and the third row sensing pattern SP13 may overlap the third connection line BL1-B on a plane. The third connection lines BL1-B may be electrically connected to the second row sensing pattern SP12 and the third row sensing pattern SP13 through an overlapping area. The second row sensing pattern SP12 and the third row sensing pattern SP13 have a size overlapping the third connection line BL1-B on a plane. Accordingly, the third row sensing pattern SP13 may have a relatively greater area than the third column sensing pattern SP23 or the fourth column sensing pattern SP24.

The second row sensing pattern SP12 may be disposed between the first and second module holes MH1 and MH2 to face each of the first and second module holes MH1 and MH2. Accordingly, the second row sensing pattern SP12 may overlap each of the first connection lines BL1-A and the third connection lines BL1-B. According to the present invention, the first to fifth row sensing patterns SP11, SP12, SP13, SP14, and SP15 may be electrically connected through the first connection line BL1-A and the third connection line BL1-B to form one row sensing electrode.

Meanwhile, in the present embodiment, the first column sensing pattern SP21 and the second column sensing pattern SP22 may overlap the second connection line BL2-A on a plane. To this end, the first column sensing pattern SP21 and the second column sensing pattern SP22 each may include protrusions to overlap the second connection line BL2-A. The second connection line BL2-A may be electrically connected to the first column sensing pattern SP21 and the second column sensing pattern SP22 through the protrusions. Detailed descriptions will be replaced with those for the first and second protrusions P21B and P22B shown in FIG. 8C.

Similarly, the third column sensing pattern SP23 and the fourth column sensing pattern SP24 may include protrusions overlapping the fourth connection line BL2-B on a plane. The fourth connection line BL2-B may be electrically connected to the third column sensing pattern SP23 and the fourth column sensing pattern SP24 through the protrusions.

According to the present invention, the first and second column sensing patterns SP21 and SP22 may be electrically connected through the second connection line BL2-A to form one column sensing electrode. In addition, the third and fourth column sensing patterns SP23 and SP24 may be electrically connected through the fourth connection line BL2-B to form another column sensing electrode.

According to the present invention, even when the plurality of module holes MH1 and MH2 are defined in the active area AA, shapes of the sensing patterns SP11, SP12, SP13, SP14, SP15, SP21, SP22, SP23, and SP24 and the shapes of the connecting lines BL1-A, BL1-B, BL2-A, and BL2-B may be variously configured to provide an electronic panel 200-P capable of providing even sensitivity in a front surface of the active area AA.

Figure 12A:
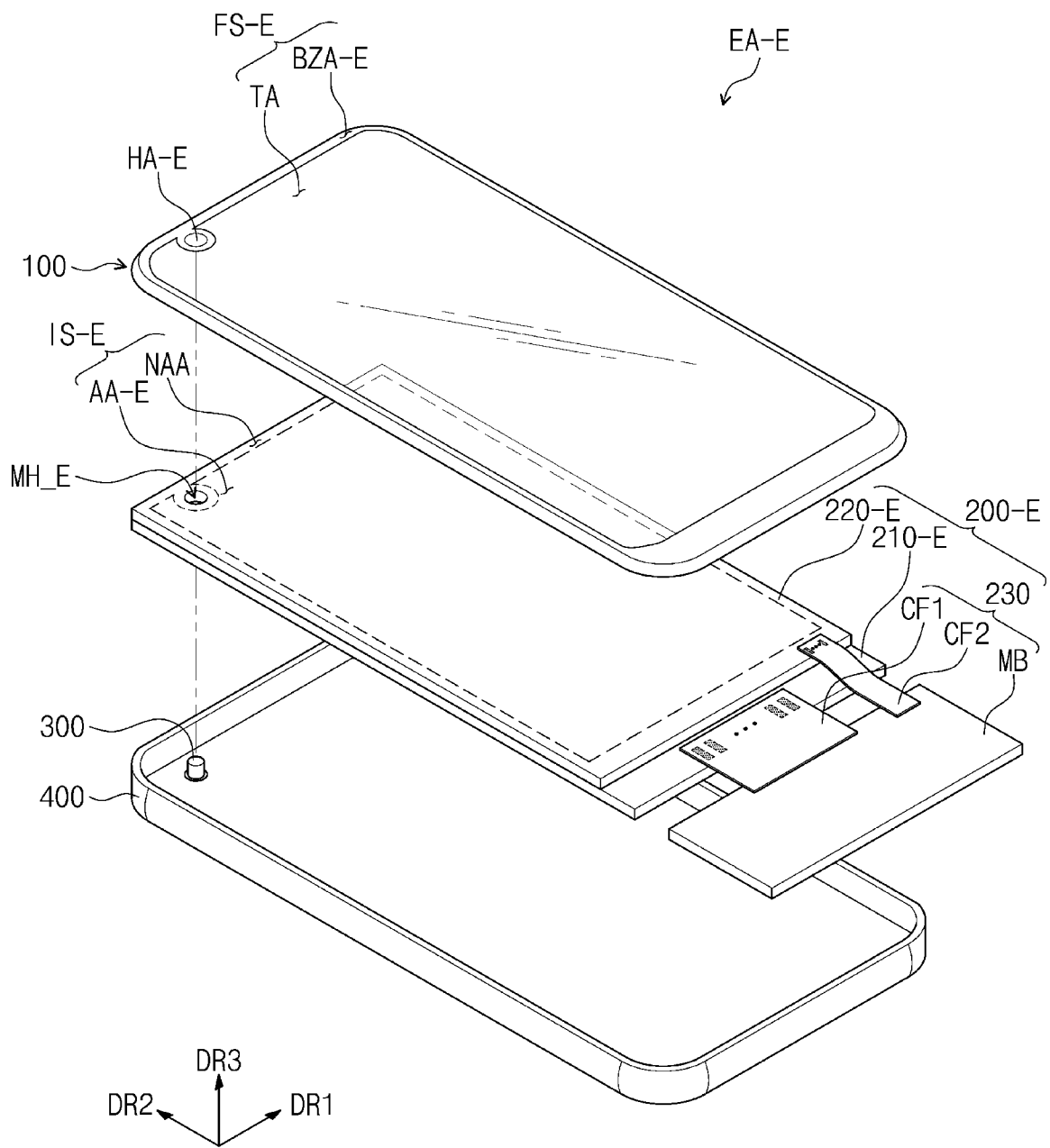
Figure 12B:
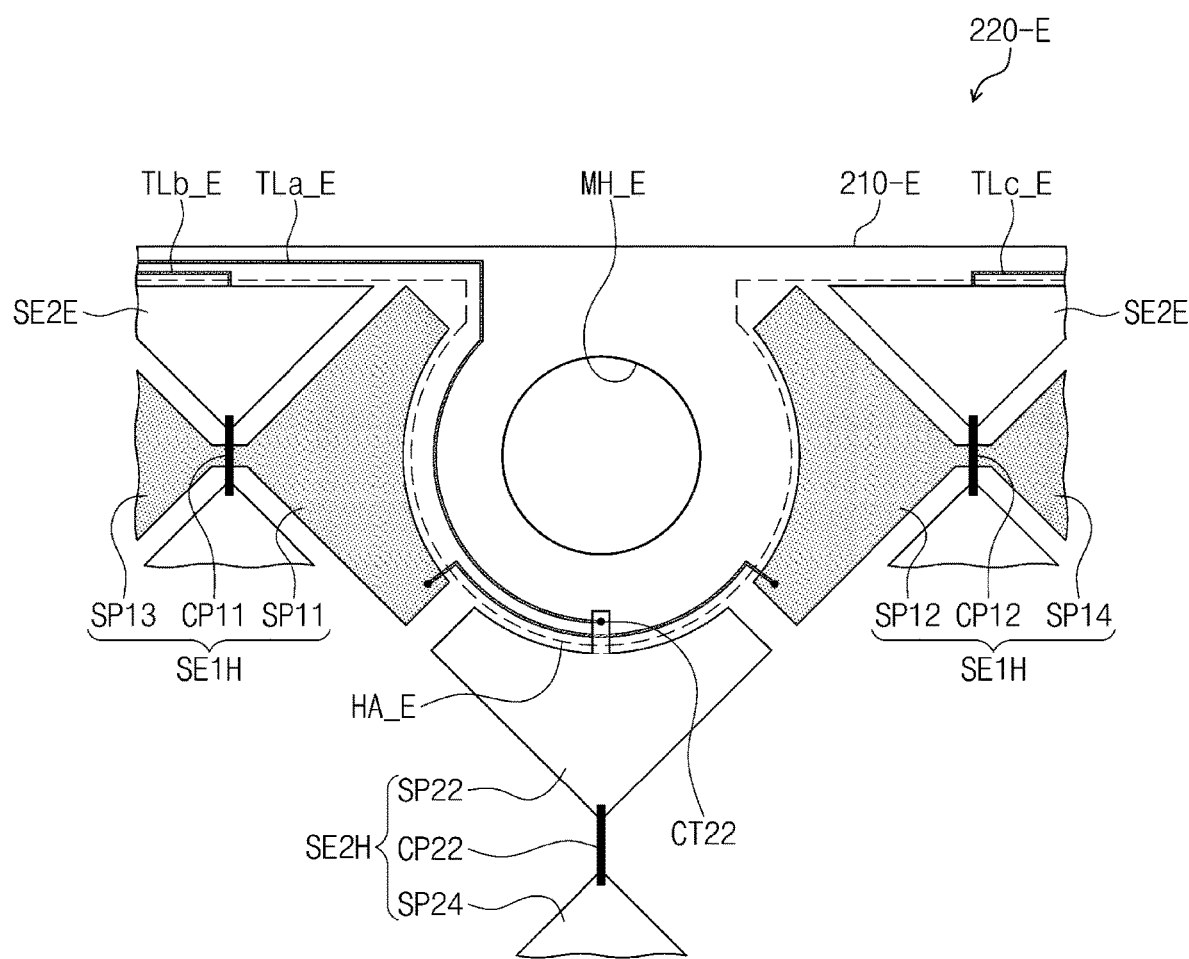
Figure 12C:
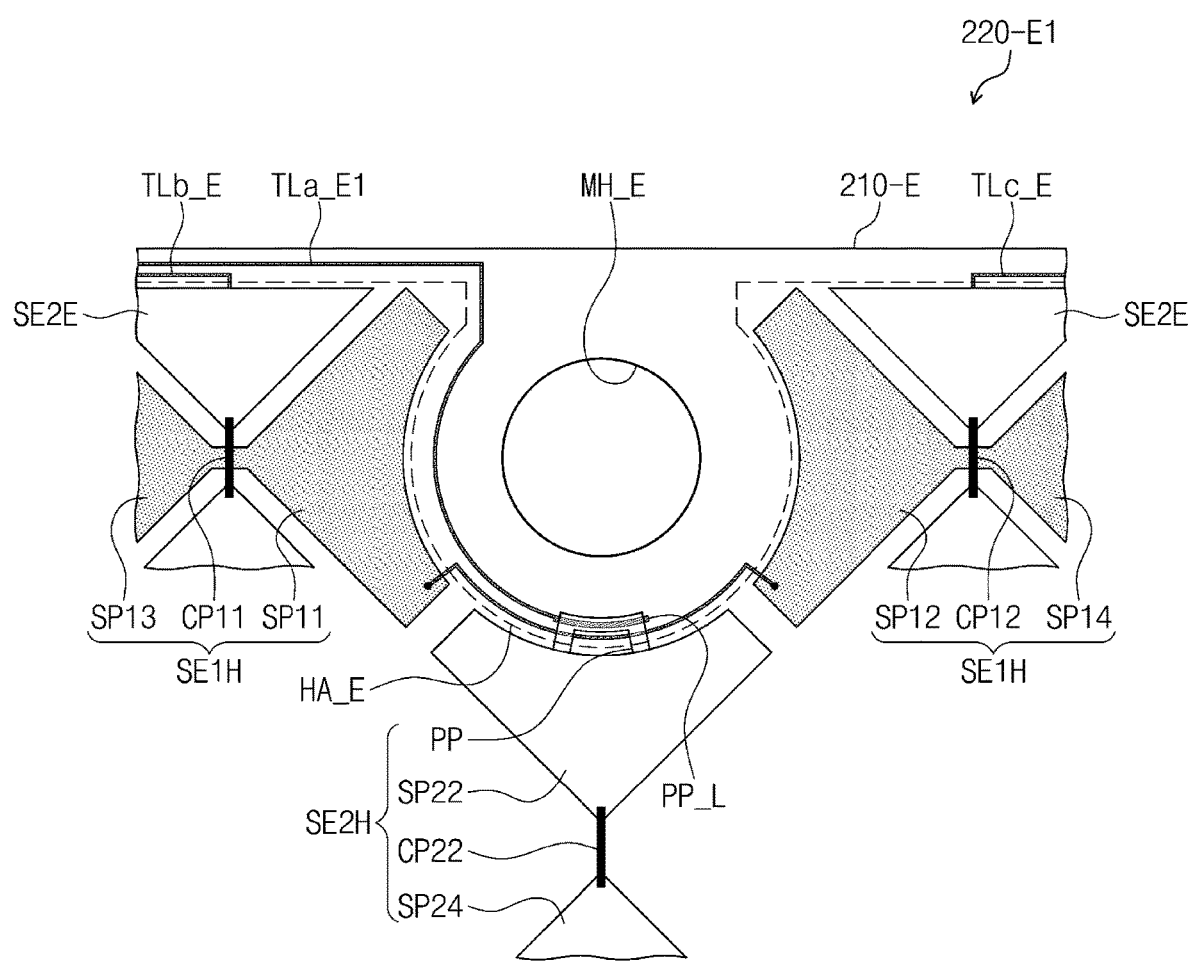

FIG. 12A is an exploded perspective view of an electronic apparatus according to an embodiment of the present invention. FIGS. 12B and 12C are plan views illustrating a portion of a sensing unit according to an embodiment of the present invention. In FIG. 12B, a partial area illustrated in FIG. 12A is enlarged, and in FIG. 12C, an area corresponding to FIG. 12B is illustrated. For the convenience of description, some components are omitted in each of FIGS. 12B and 12C. Hereinafter, embodiments of the present invention will be described with reference to FIGS. 12A to 12C. Meanwhile, the same reference numerals are applied to the same configurations as those described in FIGS. 1A to 11B, and redundant descriptions will be omitted.

As shown in FIG. 12A, in an electronic apparatus EA-E, a module hole MH_E may be defined adjacent to the peripheral area NAA. Accordingly, in a front surface IS-E of an electronic panel 200-E, an active area AA-E may be defined along an edge of the module hole MH_E, and a hole area HA-E may be disposed to overlap the peripheral area NAA.

To be specific, in the window member 100, a transmission area TA-E and a bezel area BZA-E of a front surface FS-E may be provided in a slightly modified shape from the transmission area TA and the bezel area BZA of the front surface FS shown in FIG. 1B, and this may be caused by changing the position of the module hole MH_E to be adjacent to the peripheral area NAA.

In FIG. 12B, a portion of a sensing unit 220-E in an area where the module hole MH_E is disposed is shown briefly, and an end of a display unit 210-E is shown for the convenience of description. FIG. 12B illustrates a first sensing electrode SE1H, a plurality of second sensing electrodes SE2H and SE2E, and a plurality of sensing lines Tla_E, TLb_E, and TLc_E among the components of the electronic unit 220-E. The second sensing electrodes SE2H and SE2E may include a hole electrode SE2H facing the module hole MH_E, and a plurality of main electrodes SE2E spaced apart from each other in the row direction with the module hole MH_E therebetween.

The first sensing electrode SE1H includes first to fourth row sensing patterns SP11, SP12, SP13, and SP14, and first connection patterns CP11 and CP12. The first row sensing pattern SP11 and the second row sensing pattern SP12 are disposed to be spaced apart from each other with the module hole MH_E therebetween, and may be connected through a connection line. The first sensing electrode SE1H may correspond to the first sensing electrode SE1 shown in FIG. 7A, and redundant descriptions will be omitted.

A hole electrode SE2H is disposed below the module hole MH_E. The hole electrode SE2H may be one of electrodes adjacent to the module hole MH_E together with the first sensing electrode SE1H. The hole electrode SE2H includes a second column sensing pattern SP22, a fourth column sensing pattern SP24, and a second connection pattern CP22. Since the second column sensing pattern SP22, the fourth column sensing pattern SP24, and the second connection pattern CP22 correspond to the second column sensing pattern SP22, the fourth column sensing pattern SP24, and the second connection pattern CP22 shown in FIG. 7B, redundant descriptions will be omitted.

Meanwhile, in the present embodiment, a sensing electrode may not be disposed above the module hole MH_H. An active area AA-E extends along at least a portion of the edge of the module hole MH_E. Accordingly, the edge of the hole area HA-E and the edge of the active area AA-E may be connected.

The main electrodes SE2E may be disposed to be spaced apart from each other along the row direction around the module hole MH_E. The main electrodes SE2E each may insulatively cross the first sensing electrode SE1H.

The sensing lines Tla_E, TLb_E, and TLc_E may be respectively connected to the hole electrode SE2H and the main electrodes SE2E. The sense lines Tla_E, TLb_E, and TLc_E each may be substantially any one of the third sense lines TL3 (see FIG. 3C) shown in FIG. 3C. The sensing lines Tla_E, TLb_E, and TLc_E may include a hall sensing line Tla_E connected to the hall electrode SE2H, and a plurality of main sensing lines TLB_E and TLc_E each connected to the main electrodes SE2E.

The hole sensing line Tla_E is connected to the hole electrode SE2H. The hole sensing line Tla_E passes through the peripheral area NAA to extend along the edge of the module hole MH_E so as to be connected to the second column sensing pattern SP22 of the hole electrodes SE2H. In this case, a predetermined contact portion CT22 may be formed between a portion of the second column sensing pattern SP22 protruding to an inner side of the hole area HA_E and the hole sensing line Tla_E. The portion of the second column sensing pattern SP22 protruding to the inner side of the hole area HA_E is disposed on a different layer from the connection line, and the hole sensing line Tla_E may thus be stably connected to the hole electrode SE2H without electrical interference with the connection line.

The main sensing lines TLb_E and TLc_E are respectively connected to the main electrodes SE2E. Although not shown, the main sensing lines Tlb_E and TLc_E may be connected to some of the main electrodes SE2E protruding to the peripheral area NAA, or may extend to the inside of the active area AA_E to be connected to the main electrodes SE2E.

According to the present invention, even when the connection between the hole sensing line Tla_E and the hall electrode SE2H is made adjacent to the module hole MH_E, the connection may be stably made without electrical interference with the first sensing electrode SE1H. Accordingly, even when the module hole MH_E is formed to overlap the edge of the active area AA_E or the peripheral area NAA, the sensing unit 220-E having improved electrical reliability may be provided.

Alternatively, referring to FIG. 12C, in a sensing unit 220-E1, the hole electrode SE2H1 may further include a junction portion PP. The junction portion PP may be connected to the second column sensing pattern SP22 to extend to the inside of the hole area HA_E.

The hole sensing line Tla_E1 is connected to the hole electrode SE2H1 through the junction portion PP. A portion PP_L of the hole sensing line Tla_E1 may have a large width. In the present embodiment, the portion PP_L of the hole sensing line Tla_E1 overlapping the junction portion PP may have a greater width than the remaining portions, thereby improving a connection area with the hole electrode SE2H1.

Meanwhile, in the present embodiment, the junction portion PP may have a shape in which a portion overlapping the connection line is open. Accordingly, a noise defect due to parasitic capacitance generated between the connection line and the second column electrode SP22 may be reduced.

According to the present invention, even when the connection between the hole sensing line Tla_E1 and the hall electrode SE2H1 is made adjacent to the module hole MH_E, the connection may be stably made without electrical interference with the first sensing electrode SE1H. Accordingly, the sensing unit 220-E1 having improved electrical reliability may be provided.

Although the present invention has been described with reference to a preferred embodiment of the present invention, it will be understood that the present invention should not be limited to these preferred embodiments but various changes and modifications can be made by those skilled in the art without departing from the spirit and scope of the present invention.

Accordingly, the technical scope of the present invention is not intended to be limited to the contents set forth in the detailed description of the specification, but is intended to be defined by the appended claims.

The invention claimed is:

1. An electronic apparatus, comprising:
a base substrate including an active area and a peripheral area adjacent to the active area;
a display unit disposed on the base substrate and configured to display an image within the active area; and
a sensing unit disposed on the display unit and configured to detect an external input applied to the active area,
wherein, in the active area, a module hole penetrates the base substrate, the display unit, and the sensing unit, wherein the sensing unit includes:
a first sensing pattern and a second sensing pattern spaced apart from each other in a first direction with the module hole disposed therebetween;
a third sensing pattern and a fourth sensing pattern spaced apart from each other in a second direction crossing the first direction with the module hole disposed therebetween;
a first connection line extending along a portion of the module hole and connecting the first sensing pattern and the second sensing pattern to each other; and
a second connection line extending along a portion of the module hole and connecting, the third sensing pattern and the fourth sensing pattern to each other, and
wherein the first connection line and the second connection line are disposed on a same layer and are spaced apart from each other.

2. The electronic apparatus of claim 1, wherein a separation distance between the first connection line and the module hole is greater than a separation distance between the second connection line and the module hole.

3. The electronic apparatus of claim 2, wherein the third sensing pattern or the fourth sensing pattern overlaps the first connection line.

4. The electronic apparatus of claim 2, further comprising a first conductive pattern disposed between the first connection line and the second connection line,
wherein the first conductive pattern is spaced apart from both the first connection line and the second connection line.

5. The electronic apparatus of claim 4, further comprising a second conductive pattern disposed between the second connection line and the module hole,
wherein the second conductive pattern is spaced apart from the second, connection line.

6. The electronic apparatus of claim 1, wherein the first connection line is disposed on a same layer as the second connection line, and is disposed on a different layer from each of the first sensing pattern and the second sensing pattern.

7. The electronic apparatus of claim 1, wherein the sensing unit further comprises:
a fifth sensing pattern that is part of the first sensing pattern, the fifth sensing pattern being disposed at a side opposing to a side facing the module hole;
a sixth sensing pattern that is part of the third sensing pattern, the sixth sensing pattern being disposed at a side opposing to a side facing the module hole;
a first connection pattern spaced apart from the first connection line and connecting the first sensing pattern and the fifth sensing pattern to each other; and
a second connection pattern spaced apart from the second connection line and connecting the third sensing patters, and the sixth sensing pattern to each other,
wherein the first connection pattern and the second connection pattern are spaced apart from each other with an insulating layer disposed therebetween, and
wherein the first connection line and the second connection line are disposed on the same layer as the first connection pattern or the second connection pattern.

8. The electronic apparatus of claim 7, wherein the first sensing pattern is directly connected to the first connection pattern, and is connected to the first connection line by penetrating the insulating layer.

9. The electronic apparatus of claim 7, wherein the third sensing pattern is connected to each of the second connection pattern, and the second connection line by penetrating the insulating layer.

10. The electronic apparatus of claim 9, wherein the third sensing pattern comprises:
a first portion spaced apart from the first connection line; and
a second portion connected to the first portion and overlapping at least a portion of the first connection line,
wherein the second portion is connected to the second connection line by penetrating the insulating layer.

11. The electronic apparatus of claim 10, wherein the second portion is disposed on a different layer from the first portion.

12. The electronic apparatus of claim 1, wherein the first connection line has a closed line shape surrounding the module hole.

13. The electronic apparatus of claim 1, wherein the second connection line has a closed line shape surrounding the module hole.

14. The electronic apparatus of claim 1, wherein:
the display unit comprises a plurality of pixels disposed in the active area, the plurality of pixels defining a plurality of light emitting areas; and
the connection line is spaced apart from the plurality of pixels.

15. The electronic apparatus of claim 14, wherein:
each of the first to fourth sensing patterns comprises a mesh pattern in which openings are defined; and
the plurality of light emitting areas respectively overlap the openings.

16. The electronic apparatus of claim 1, further comprising a dummy pattern disposed between the first connection line and the second connection line, between the second sensing pattern and the first connection line, or between the first sensing pattern and the second connection line, and
wherein the dummy pattern is electrically conductive.

17. An electronic apparatus, comprising:
a window member including a transmission area and a bezel area adjacent to the transmission area;
an electronic panel disposed below the window member, including a plurality of sensing electrodes overlapping the transmission area, and having a module hole overlapping and penetrating the transmission area defined therein; and
an electronic module disposed below the window member and overlapping the module hole,
wherein the sensing electrodes include:
a first sensing pattern and a second sensing pattern spaced apart from each other in a first direction with the module hole disposed therebetween;
a third sensing pattern and a fourth sensing pattern spaced apart from each other in a second direction crossing the first direction with the module hole disposed therebetween;
a first connection line disposed adjacent to the module hole and connecting the first sensing pattern and the second sensing pattern to each other; and
a second connection line disposed adjacent to the module hole and connecting the third sensing pattern and the fourth sensing pattern to each other,
wherein the first connection line and the second connection line are spaced apart from each other.

18. The electronic apparatus of claim 17, wherein the first connection line is disposed on a same layer as the second connection line, and the first connection line is disposed on a different layer from the first to fourth sensing patterns.

19. The electronic apparatus of claim 17, wherein the second connection line is closer to the module hole than the first connection line is to the module hole.

20. The electronic apparatus of claim 19, wherein the third sensing pattern or the fourth sensing pattern overlaps the first connection line.

21. The electronic apparatus of claim 17, wherein the first connection line and the second connection line each comprise at least one curve,
wherein the at least one curve extends along a periphery of the module hole.

22. The electronic apparatus of claim 21, wherein the first sensing pattern and the second sensing pattern are spaced apart from the at least one curve,
wherein the first connection line further comprises:
a first end portion extending from a first end of the at least one curve to overlap the first sensing pattern; and
a second end portion extending from a second end of the at least one curve to overlap the second sensing pattern, and
wherein contact portions among the first connection line, the first sensing pattern, and the second sensing pattern are defined at the first and second end portions.

23. The electronic apparatus of claim 21, wherein the first sensing pattern and the second sensing pattern each comprise:
a main portion spaced apart from the at least one curve; and
a protrusion connected to the main portion and overlapping the at least one curve, and
wherein a contact portion between the first connection line and the first sensing pattern, and a contact portion between the first connection line and the second sensing pattern are defined on the protrusion.

24. The electronic apparatus of claim 23, wherein the protrusion is disposed on a same layer as the main portion and the protrusion forms a single contiguous structure with the main portion.

25. The electronic apparatus of claim 23, wherein the protrusion is disposed on a different layer from the main portion, and the protrusion is connected to each of the main portion and the first connection line by penetrating at least one insulating layer.

26. The electronic apparatus of claim 23, wherein the protrusion has a shape extending along a portion of the at least one curve.

27. The electronic apparatus of claim 23, wherein the protrusion has a bar shape extending primarily along a direction crossing the at least one curve.

28. The electronic apparatus of claim 23, wherein the protrusion of the first sensing pattern or the protrusion of the second sensing pattern overlaps the second connection line.

29. The electronic apparatus of claim 17, wherein the first connection line or the second connection line is provided as a plurality of lines that are spaced apart from each other in the second direction with the module hole disposed therebetween.

30. The electronic apparatus of claim 17, wherein the first connection line or the second connection line has a closed line shape surrounding the module hole.

* * * * *